United States Patent
Sano et al.

(10) Patent No.: US 6,180,870 B1
(45) Date of Patent: *Jan. 30, 2001

(54) PHOTOVOLTAIC DEVICE

(75) Inventors: Masafumi Sano, Kyoto; Tetsuro Nakamura, Kyotanabe, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/917,888

(22) Filed: Aug. 27, 1997

(30) Foreign Application Priority Data

Aug. 28, 1996 (JP) .................................... 8-226651

(51) Int. Cl.[7] ............................................... H01L 31/0264
(52) U.S. Cl. ........................................... 136/258; 136/261
(58) Field of Search ..................................... 136/261, 258

(56) References Cited

U.S. PATENT DOCUMENTS

| | | | |
|---|---|---|---|
| 2,949,498 | 8/1960 | Jackson ................................... | 136/89 |
| 4,490,573 | * 12/1984 | Gibbons et al. ...................... | 136/261 |
| 4,926,229 | * 5/1990 | Nakagawa et al. ................... | 136/258 |
| 5,252,142 | * 10/1993 | Matsuyama et al. ................. | 136/258 |
| 5,429,685 | 7/1995 | Saito et al. ............................ | 136/255 |

OTHER PUBLICATIONS

Miyachi, et al. "Fabrication of Single Pin Type Solar Cells With A High Conversion Efficiency of 13.0%", 11th E.C. Photovoltaic Solar Energy Conf., Oct. 12–16, 1992 Switzerland, pp. 88–91.

Meier, et al., "intrinsic Microcrystalline Silicon (uc–Si:H)—A Promising New Thin Film Solar Cell Material", 1994 IEEE 1st World Conf.—Photovoltaic Energ. Conv., Conf. Record, vol. 1. 1994 p. 409–412.

Zweibel, et al.; "The Doe/SERI Polycrystalline Thin Film Subcontract Program", 20th IEEE Photovoltaic Spec. Conf.—1988, vol. II, Conf. Record, Nevada, 1988 pp. 1469–1476.

K. Nomoto, et al., "A–Si Alloy Three–Stacked Solar Cells with High Stabilized–Efficiency", Technical Digest of 7th Photovoltaic Science and Engineering Conf., pp. 275–276, Nagoya 1993.

H. Takakura, et al., "Device Physics and Optimum Design of a–Si/poly Si Tandem Solar Cells", Proc. 4th Int'l Photovoltaic Science and Engineering Conf., pp. 403–408, Feb. 1989.

* cited by examiner

Primary Examiner—Christopher D. Rodee
(74) Attorney, Agent, or Firm—Fitzpatrick, Cella, Harper & Scinto

(57) ABSTRACT

In a photovoltaic device having a plurality of pin structures, the pin structures comprise a first pin structure, a second pin structure and a third pin structure in the order from the light-incident side, each having an i-type semiconductor layer, and the i-type semiconductor layer of the first pin structure comprises amorphous silicon, the i-type semiconductor layer of the second pin structure comprises microcrystalline silicon and the i-type semiconductor layer of the third pin structure comprises amorphous silicon germanium or microcrystalline silicon germanium. The photovoltaic device according to the present invention provides a superior photoelectric conversion efficiency and less causing photodeterioration.

21 Claims, 5 Drawing Sheets

PHOTOVOLTAIC DEVICE

BACKGROUND OF THE INVENTION

1. Field of the Invention

This invention relates to a photovoltaic device such as a solar cell or a sensor, having a plurality of pin structures superposingly formed.

2. Related Background Art

Thin-film photovoltaic devices making use of amorphous semiconductors in photovoltaic layers have advantages such that large-area films can be produced as compared with single-crystal photovoltaic devices, films can be formed in a smaller thickness and the films can be deposited on any substrate materials, and are considered to be promising.

As a means for improving photoelectric conversion efficiency of the photovoltaic devices making use of amorphous semiconductors, it is attempted, e.g., to incorporate germanium to thereby narrow the band gap to make the sensitivity to long-wavelength light higher.

However, semiconductor materials called amorphous silicon germanium have commonly often caused a decrease in photoconductivity with an increase in the content of germanium. In particular, amorphous silicon germanium containing 35 atm % or more of germanium has often caused a remarkable decrease in photoconductivity. Accordingly, for photovoltaic devices making use of largely germanium-containing amorphous silicon germanium in i-type semiconductor layers, it has been difficult to attain a high photoelectric conversion efficiency.

This is considered due to the fact that localized levels in the band gap increase with an increase in the content of germanium to cause an increase in tail-state levels at the conduction band ends and valence electron band ends, resulting in a short diffusion length of electrons and holes.

As another method for improving photoelectric conversion efficiency of the photovoltaic devices, U.S. Pat. No. 2,949,498 discloses use of what is called a stacked cell in which a plurality of photovoltaic devices having a unit device structure are superposed. The stacked cell is a cell in which devices having different band gaps are superposed to absorb every part of spectra of sunlight in a good efficiency so that the photoelectric conversion efficiency can be improved, and is so designed that the band gap in what is called the bottom layer, which is positioned beneath what is called the top layer, positioned on the light-incident side of the superposed devices, is narrower than the band gap in the top layer. This enables good absorption of spectra of sunlight to bring about an improvement in photoelectric conversion efficiency; see K. Miyachi et al., Proc. 11th, E.C. Photovoltaic Solar Energy Conf., Montreux, Switzerland, 88, 1992, or K. Nomoto et. al., "a-Si Alloy Three-Stacked Solar Cells with High Stabilized Efficiency", 7th Photovoltaic Science and Engineering Conf., Nagoya, 275, 1993.

However, amorphous silicon and amorphous silicon germanium have the problem of a lowering of film quality as a result of irradiation with light, i.e., what is called the Stebler-Ronskie effect. This is a phenomenon peculiar to amorphous semiconductors, which is not seen in crystal systems. Hence, under existing circumstances, they have a poor reliability when used for electric-power purpose, which is an obstacle to their practical application.

Meanwhile, in recent years, studies are made on not only stacked cells of an amorphous/amorphous system but also those of an amorphous/crystalline system, and improvements in photoelectric conversion efficiency of photovoltaic devices are reported; see Hamakawa, Y et al. "Device Physics and Optimum Design of a-Si/Poly Si Tandem Solar Cells", Proceedings of 4th International PVSEC, pp. 403–408, February 1989, A. Shah, H. Keppner, et al., "Intrinsic Microcrystalline Silicon ($\mu$-c-Si:H)-A Promising New Thin-film Solar Cell Material", IEEE First World Conference on Photovoltaic Energy Conversion, pp. 409–412, December 1994, or Michell, R. L. et al., "The DOE/SERI Polycrystalline Thin-film Subcontract Program", Proceedings of 20th IEEE Photovoltaic Specialists Conference, pp. 1469–1476, September 1988.

However, taking account of the balance of electric currents generated by light in the stacked cells, the cell on the light-incident side (having a broad band gap) must be made to have a larger thickness, causing a problem that photo-deterioration may greatly occur when films have a large thickness.

SUMMARY OF THE INVENTION

An object of the present invention is to solve the above problems to provide a photovoltaic device having a superior photoelectric conversion efficiency and also less causing photo-deterioration.

The present invention provides a photovoltaic device having a plurality of pin structures, wherein;

the pin structures comprise a first pin structure, a second pin structure and a third pin structure in the order from the light-incident side, each having an i-type semiconductor layer; and the i-type semiconductor layer of the first pin structure comprises amorphous silicon, the i-type semiconductor layer of the second pin structure comprises microcrystalline silicon and the i-type semiconductor layer of the third pin structure comprises amorphous silicon germanium or microcrystalline silicon germanium.

Figure 1:
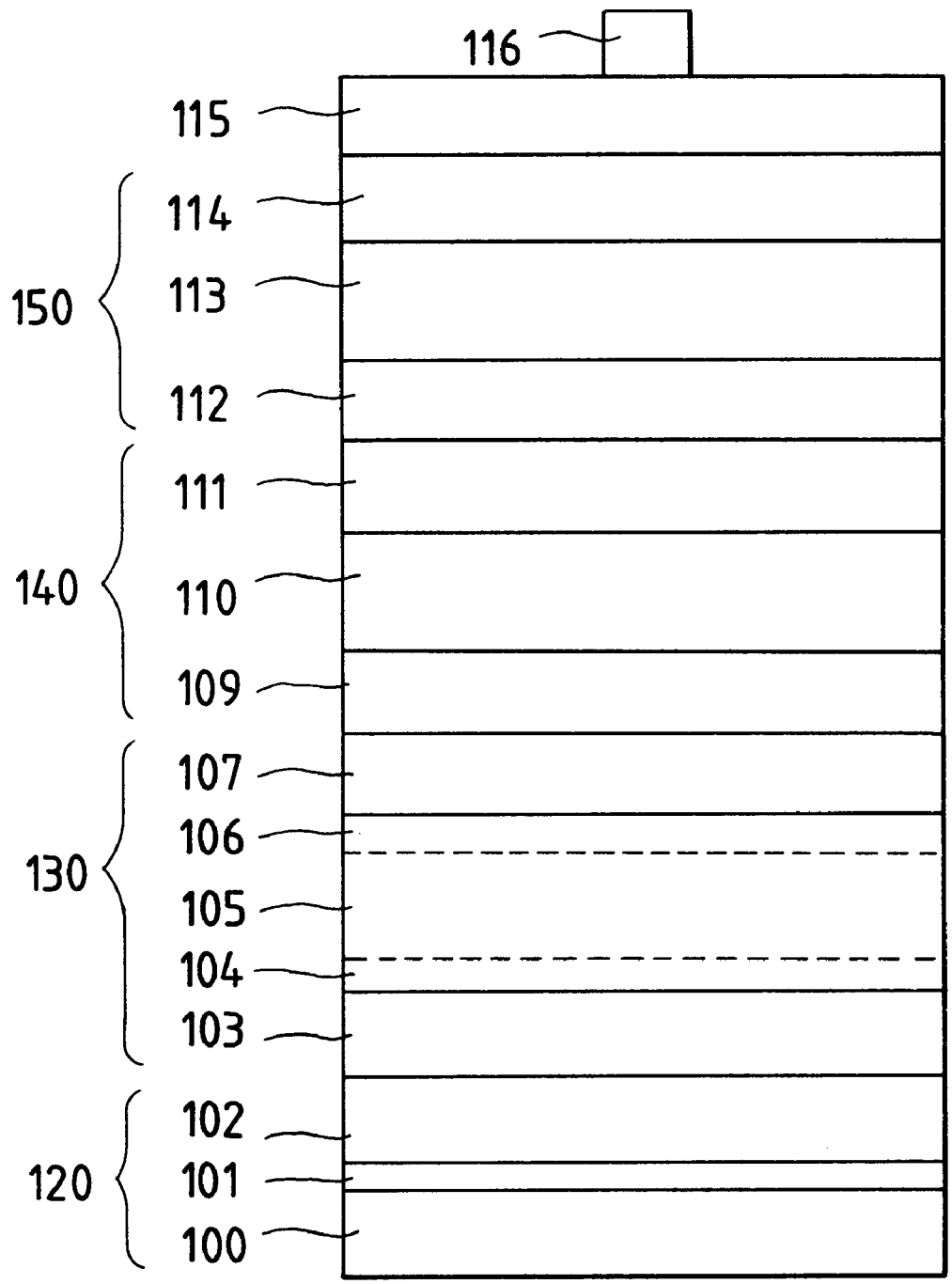
FIG. 1 is a cross-sectional view diagrammatically showing the layer configuration of an example of the photovoltaic device according to the present invention.

DESCRIPTION OF THE PREFERRED EMBODIMENTS (1) The photovoltaic device of the present invention has a plurality of pin structures, comprised of a first pin structure, a second pin structure and a third pin structure in the order from the light-incident side, each having an i-type semiconductor layer, and is characterized in that the i-type semiconductor layer of the first pin structure comprises amorphous silicon, the i-type semiconductor layer of the second pin structure comprises microcrystalline silicon and the i-type semiconductor layer of the third pin structure comprises amorphous silicon germanium or microcrystalline silicon germanium.

This is based on a finding that a triple type photovoltaic device having pin structures superposed in three sets may less cause photo-deterioration than a double type photovoltaic device having pin structures superposed in two sets. When semiconductor materials of the same type are used, the triple type device is considered to cause less electric currents generated by light per each pin structure than the double type device, resulting in a decrease in the recombination of holes and electrons that causes the photo-deterioration of amorphous semiconductors.

In the following description, the first, second and third pin structures in the order from the light-incident side are often called a top cell, a middle cell and a bottom cell, respectively.

The microcrystalline silicon is more sensitive to light with a long wavelength than amorphous silicon, and hence the device has a construction wherein the i-type semiconductor layer of the top cell has amorphous silicon and the i-type semiconductor layer of the middle cell has microcrystalline silicon so that the top cell absorbs light with a relatively short wavelength and the middle cell absorbs light with a relatively long wavelength.

The i-type semiconductor layer of the bottom cell has amorphous silicon germanium, whereby the bottom cell can be made more sensitive to light with a long wavelength than the middle cell. Also, the i-type semiconductor layer of the bottom cell may have microcrystalline silicon germanium, whereby the bottom cell can be made sensitive to light with a much longer wavelength and can be made to less cause photo-deterioration.

Since the middle cell i-type semiconductor layer has microcrystalline silicon, the middle cell also can be made to less cause photo-deterioration. In the case where amorphous silicon germanium is used in the bottom cell, it has been found that the middle cell i-type semiconductor layer may preferably have a layer thickness of from 300 nm to 2,200 nm, and more preferably from 500 nm to 2,000 nm. In the case where microcrystalline silicon germanium is used in the bottom cell, it has been also found that the middle cell i-type semiconductor layer may preferably have a layer thickness of from 500 nm to 2,500 nm, and more preferably from 600 nm to 2,200 nm.

If the layer thickness is smaller than the above lower limit, the electric current generated by light may be so little that the photoelectric conversion efficiency required as the triple cell may lower. If it is larger than the above upper limit, the electric current generated in the middle cell can be sufficient but the amount of the light entering the bottom cell may decrease, so that the electric current generated in the bottom cell may become too little to make adjustment of electric current values of the respective cells, resulting in a low photoelectric conversion efficiency.

The top cell i-type semiconductor layer may preferably have a layer thickness of from 50 nm to 250 nm, and more preferably from 70 nm to 150 nm. In the case where amorphous silicon germanium is used in the bottom cell, it has been found that the bottom cell i-type semiconductor layer may preferably have a layer thickness of from 60 nm to 250 nm, and more preferably from 80 nm to 180 nm. In the case where microcrystalline silicon germanium is used in the bottom cell, it has been found that the bottom cell i-type semiconductor layer may preferably have a layer thickness of from 200 nm to 2,000 nm.

(2) The i-type semiconductor layer microcrystalline silicon in the middle cell may be incorporated with a trace amount of boron. Thus, the hole mobility at the time of generation of electric current by light can be improved to thereby maintain a high photoelectric conversion efficiency while preventing photo-deterioration. The boron may be incorporated in an amount of not more than 8 ppm. Thus, the growth of microcrystals of the microcrystalline silicon is not inhibited and the film quality can be prevented from lowering because of any excess inert boron.

(3) An n-type semiconductor layer of the middle cell may have microcrystalline silicon or a laminated structure formed of microcrystalline silicon and amorphous silicon. This has been found to be effective for the following:

1) The microcrystalline silicon of the i-type semiconductor layer formed on the n-type layer can be formed at a high deposition rate, so that inclusion of any impurities can be prevented as far as possible and good-quality microcrystalline silicon can be formed.

2) The microcrystalline silicon of the i-type semiconductor layer formed on the n-type layer can be formed in a state of little amorphous components from the initial stage of deposition, and hence good-quality microcrystalline silicon can be formed.

3) The microcrystalline silicon of the i-type semiconductor layer formed on the n-type layer can be deposited at a much higher temperature than the deposition substrate temperature having been hitherto studied, and hence further good-quality microcrystalline silicon can be formed.

4) At the initial stage for depositing the microcrystalline silicon of the i-type semiconductor layer formed on the n-type layer, the n-type semiconductor layer can be made to be less damaged by hydrogen ions and so forth, so that a high photoelectric conversion efficiency with less photo-deterioration can be maintained.

(4) The amorphous silicon germanium of the i-type semiconductor layer of the bottom cell may preferably have a germanium content of from 45 atom % to 90 atom %, and more preferably from 48 atom % to 75 atom %. This makes smaller the band gap of the amorphous silicon germanium and makes it possible to utilize light with longer wavelengths. Hence, the values of electric current generated can be maintained even when the bottom cell has a small layer thickness.

In the case where the i-type semiconductor layer of the bottom cell is microcrystalline silicon germanium, the microcrystalline silicon germanium may preferably have a germanium content of from 40 atom % to 90 atom %, and more preferably from 45 atom % to 75 atom %, and may preferably have a light absorption coefficient at 800 nm, of 10,000 cm$^{-1}$ or above. This enables utilization of light with much longer wavelengths.

(5) A buffer layer comprised of an amorphous silicon layer or amorphous silicon carbon layer may be provided between p-type layer and i-type layer of the bottom cell. This makes diffusion potential of the pin structure larger to bring about an improvement in the open current voltage (Voc) of the photovoltaic device. The buffer layer may be further provided between n-type layer and i-type amorphous silicon germanium layer, whereby the photoelectric conversion efficiency can be more improved.

The buffer layer may preferably have a layer thickness of from 30 angstroms to 450 angstroms, and more preferably from 50 angstroms to 350 angstroms. Even when the buffer layer having such a measure of layer thickness is provided, there is almost no increase in the rate of photo-deterioration of the photovoltaic device.

(6) The germanium content in the amorphous silicon germanium layer may be changed in the layer thickness direction in such a manner that the germanium content is set maximum at a position not deeper than ¼ of the layer thickness of the whole amorphous silicon germanium layer as measured from the interface of the buffer layer on the p-type layer side. This brings about an improvement in open current voltage (Voc) and fill factor (FF).

In amorphous semiconductors, in respect of electrons and holes produced by light, the holes are considered to have a shorter diffusion length than the electrons and rate-determine the whole characteristics, so that photocarriers are largely distributed in the vicinity of the p-type layer when the band gap of the amorphous silicon germanium is changed in the layer thickness direction so that the position at which the band gap is minimum is set in the vicinity of the p-type layer, than when the band gap is present uniformly in the layer thickness direction. With regard to the holes in the photocarriers, the distance of their movement in the i-type semiconductor layer becomes shorter. Thus, these are considered to bring about an improvement in the fill factor (FF).

It is also considered that the band gap of amorphous silicon germanium may be continuously changed so that the valence electron band has a gradation, whereby the diffusion of holes in the photocarriers can be promoted to improve the open current voltage (Voc) and fill factor (FF) of the photovoltaic device.

The present invention will be described in greater detail with reference to the accompanying drawings.

FIG. 1 diagrammatically illustrates a cross section of a stack type photovoltaic device according to the present invention. The stack type photovoltaic device shown in FIG. 1 has a structure wherein three pin structures are superposed in layers. Reference numeral 150 denotes a first pin structure (top cell); 140, a second pin structure (middle cell); and 130, a third pin structure (bottom cell); which are in the order from the light-incident side. These three pin structures are superposed on a back electrode 101 formed on a substrate 100 and a transparent electrode 115 and a collector electrode 116 are formed at the uppermost part of the three pin structures to form the stack type photovoltaic device.

These pin structures are respectively comprised of n-type semiconductor layers 103, 109 and 112, i-type semiconductor layers 104(a buffer layer), 105, 106 (a buffer layer), 110 and 113 and p-type semiconductor layers 107, 111 and 114.

In the present invention, amorphous silicon is used as the i-type semiconductor layer 113 of the first pin structure, microcrystalline silicon is used as the i-type semiconductor layer 110 of the second pin structure and amorphous silicon germanium or microcrystalline silicon germanium is used as the i-type semiconductor layer 105 of the third pin structure.

Figure 2:
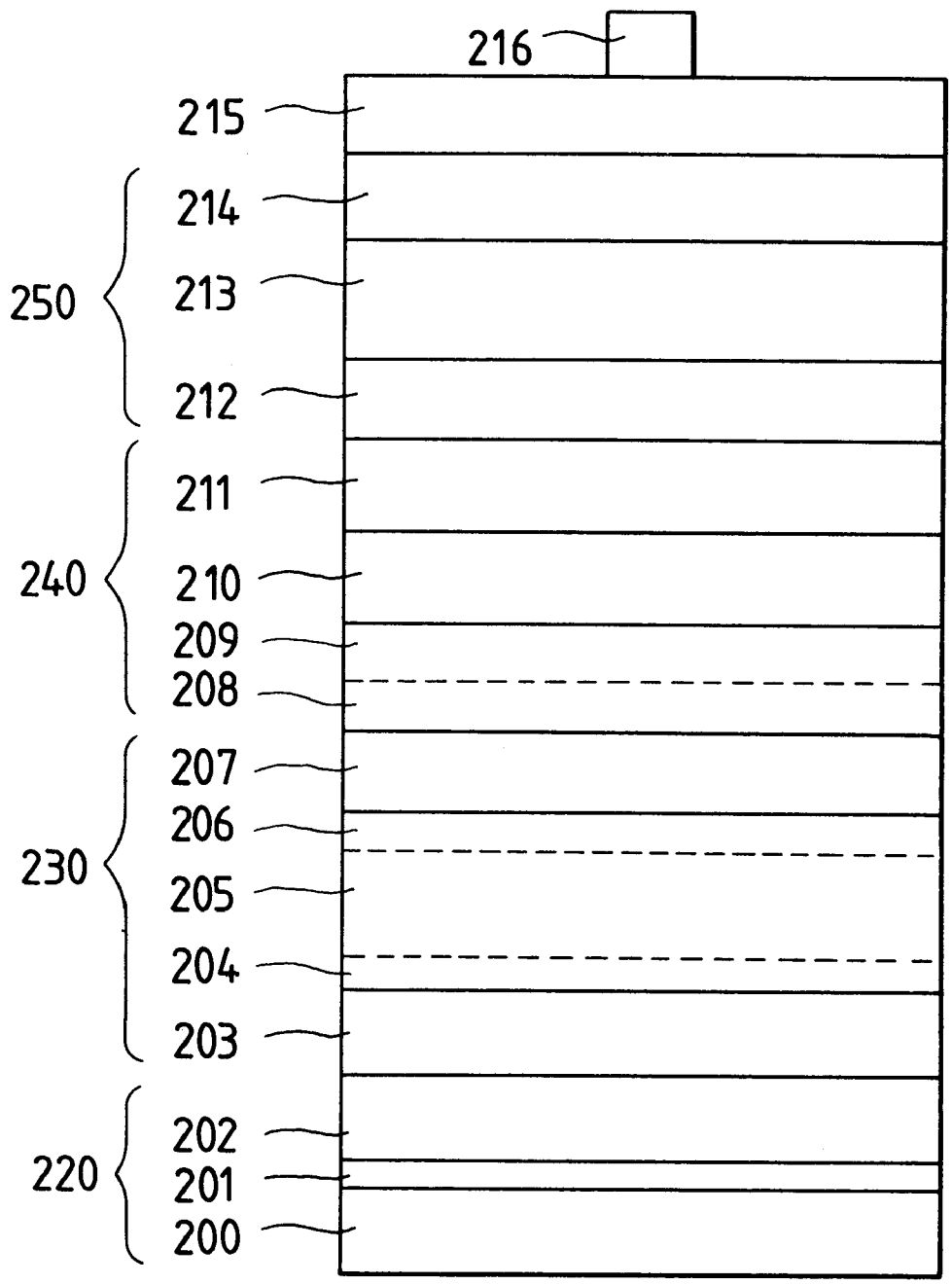
FIG. 2 is a cross-sectional view diagrammatically showing the layer configuration of another example of the photovoltaic device according to the present invention.

FIG. 2 illustrates a photovoltaic device having the same construction as the one shown in FIG. 1, except that the n-type semiconductor layer of a second pin structure 240 has a laminated structure formed of an n-type amorphous semiconductor 208 and an n-type microcrystalline semiconductor 209. More specifically, reference numeral 250 denotes a first pin structure, and 230, a third pin structure; and reference numeral 200 denotes a substrate; 201, a back electrode; 202, a diffusion preventive layer; 203, 209 and 212, n-type semiconductor layers; 204, 205, 206, 210 and 213, i-type semiconductor layers (204 and 206, buffer layers); and 207, 211 and 214, p-type semiconductor layers.

Figure 3:
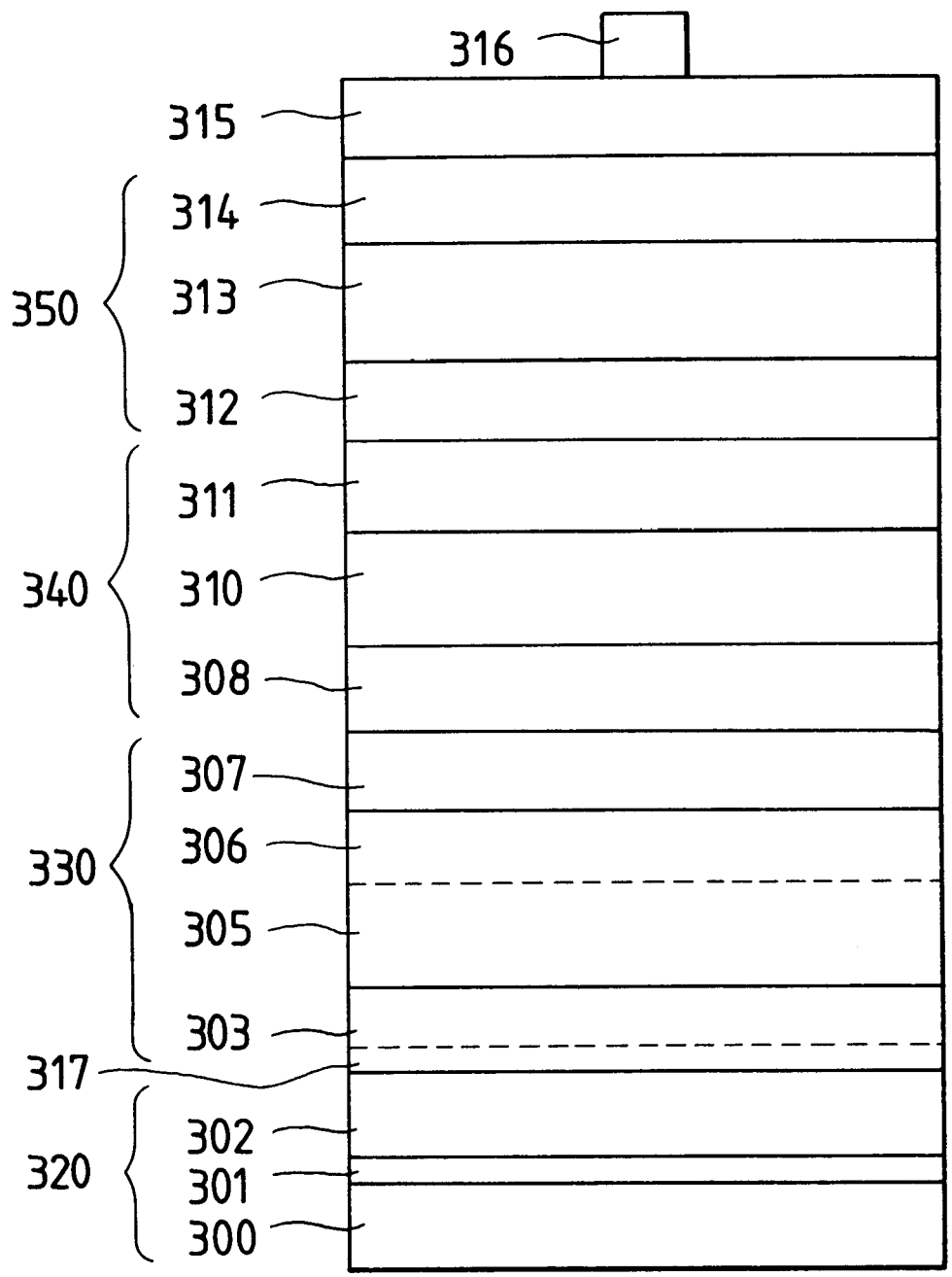
FIG. 3 is a cross-sectional view diagrammatically showing the layer configuration of still another example of the photovoltaic device according to the present invention.

FIG. 3 illustrates a photovoltaic device having a layer configuration wherein an n-type semiconductor layer of a third pin structure 330 has a laminated structure formed of an n-type amorphous semiconductor 317 and an n-type microcrystalline semiconductor 303. Also, only one layer is provided as a buffer layer 306 of an i-type semiconductor layer 305. Others are constructed in the same manner as those shown in FIG. 1. More specifically, reference numeral 350 denotes a first pin structure, and 340, a second pin structure; and reference numeral 300 denotes a substrate; 301, a back electrode; 302, a diffusion preventive layer; 308 and 312, n-type semiconductor layers; 310 and 313, i-type semiconductor layers; and 307, 311 and 314, p-type semiconductor layers.

These devices may also have layer configurations wherein the n-type semiconductor layers and p-type semiconductor layers in the pin structures are replaced with one another.

The construction of the stack type photovoltaic device of the present invention will be further detailed below.

Substrate

Since the semiconductor layers 103 to 114 are thin films of about 3 µm at most in total thickness, they are deposited on a suitable substrate. Such a substrate 100 may be either single-crystal or amorphous, and also may be either electrically conductive or electrically insulating. It may further be either light-transmitting or non-light-transmitting, but may preferably be free from deformation or strain and have a desired strength. It may specifically include thin sheets of metals such as Fe, Ni, Cr, Al, Mo, Au, Nb, Ta, V, Ti, Pt and Pb and alloys thereof as exemplified by bronze and stainless steel, and composites of these; films or sheets of heat-resistant resins such as polyester, polyethylene, polycarbonate, cellulose acetate, polypropylene, polyvinyl chloride, polyvinylidene chloride, polystyrene, polyamide, polyimide and epoxy, or composites of any of these with glass fiber, carbon fiber, boron fiber, metal fiber or the like; any of these materials subjected to surface coating by sputtering, vacuum deposition, plating or the like to cover their surfaces with a metal thin film formed of a different kind of material or an insulating thin film formed of $SiO_2$, $Si_3N_4$, $Al_2O_3$, $AlN_3$ or the like; and glasses, ceramics and so forth.

When the above substrate is used as a substrate for the photovoltaic device and when the substrate is made of an electrically conductive material such as a metal, it may serve as an electrode for directly collecting electric currents. When it is made of an electrically insulating material such as a synthetic resin, its surface on the side where deposited films are formed may preferably be previously surface-treated by plating, vacuum deposition or sputtering of a single metal, an alloy or a transparent conductive oxide (TCO), such as Al, Ag, Pt, Au, Ni, Ti, Mo, W, Fe, V, Cr, Cu, stainless steel, bronze, nichrome, $SnO_2$, $In_2O_3$, ZnO and ITO to form an electrode for collecting electric currents.

Of course, also when the substrate is made of the electrically conductive material such as a metal, a different kind of metal layer may be provided on the substrate on its side where the deposited films are formed, in order to, e.g., improve reflectance of long-wavelength light on the surface of the substrate and to prevent constituent elements from mutual diffusion between the substrate material and the deposited films. When the substrate is relatively transparent and the photovoltaic device has a layer configuration wherein the light is made incident on the side of the substrate, a conductive thin film such as the above transparent conductive oxide or metal thin film may preferably be previously formed by deposition.

With regard to the surface properties of the substrate, it may have a smooth surface, or may have a finely irregular surface. When the substrate has a finely irregular surface, it may have spherical, conical or pyramidical irregularities with their maximum height (Rmax) of preferably from 0.05 $\mu$m to 2 $\mu$m. This makes the reflection of light from the surface irregular to bring about an increase in optical path length of the reflected light. The substrate may have the shape of, e.g., a plate, a continuous-sheet belt or a cylinder. It may have a thickness as small as possible so long as the function as the substrate can be well exhibited, when the photovoltaic device is required to have a flexibility or when light is made incident on the side of the substrate. However, taking account of the production and handling of the substrate and in view of mechanical strength, it may usually have a thickness of at least 10 $\mu$m.

Back Electrode or Light-Reflecting Layer

The back electrode (a metal layer) used in the present invention is an electrode provided on the back of the semiconductor layers against the light-incident direction. Hence, it is provided at the position of 101 in FIG. 1 or, in the case where the substrate 100 is transparent and the light is made incident on the side of the substrate, it is provided at the position of 115. Materials for the back electrode may include metals such as gold, silver, copper, aluminum, nickel, iron, chromium, molybdenum, tungsten, titanium, cobalt, tantalum, niobium and zirconium, or alloys such as stainless steel. In particular, metals having a high reflectance, such as aluminum, copper, silver and gold are particularly preferred. When the metals having a high reflectance are used, the back electrode can be made to serve also as a light-reflecting layer that reflects the light having not been completely absorbed in the semiconductor layers, to return to the semiconductor layers.

The back electrode may have a flat shape, and may more preferably have an irregular shape to cause the light to scatter. In the case of the back electrode having such light-scattering irregular shape, any long-wavelength light having not been completely absorbed in the semiconductor layers can be scattered to elongate optical paths in the semiconductor layers, so that the photovoltaic device can be improved in its sensitivity to long-wavelength light to increase short-circuit currents and can be improved in photoelectric conversion efficiency. As to the light-scattering irregular shape, the difference in height (Rmax) between hills and valleys of the irregularities may preferably be from 0.2 $\mu$m to 2.0 $\mu$m. When, however, the substrate serves also as the back electrode, it is unnecessary in some cases to form the back electrode.

The back electrode may be formed by vacuum deposition, sputtering, plating or printing. When the back electrode is formed to have the light-scattering irregular shape, the metal or alloy film thus formed may be dry-etched or wet-etched, or sand-blasted or heated, to form the irregularities. Alternatively, the above metal or alloy may be vacuum-deposited on the substrate while heating it to provide the light-scattering irregular shape.

A diffusion preventive layer (a transparent conductive layer) 102 formed of conductive zinc oxide or the like may also be provided between the back electrode 101 and the n-type semiconductor layer 103. The diffusion preventive layer 102 has the effect of not only preventing the metal elements constituting the back electrode 101 from their diffusion into the n-type semiconductor layer, but also, when endowed with a little resistance, preventing short from being caused by imperfections such as pinholes between the back electrode 101 and the transparent electrode 115 which are provided so as to hold the semiconductor layers between them, and also entrapping in the photovoltaic device the light made incident after multiple interference is caused by thin films. Its surface may preferably have an irregular shape.

i-Type semiconductor layer

In the photovoltaic device of the present invention, amorphous silicon is used as the semiconductor material constituting the i-type semiconductor layer 113 of the first pin structure, microcrystalline silicon is used as the semiconductor material constituting the i-type semiconductor layer 110 of the second pin structure, and amorphous silicon germanium or microcrystalline silicon germanium is used as the semiconductor material constituting the i-type semiconductor layer 105 of the third pin structure. A slightly p-type or slightly n-type layer may also be used as the i-type semiconductor layer.

IV—IV group and III–V group type amorphous semiconductor materials contain hydrogen atoms (H,D) or halogen atoms (X) and act to compensate unbonded arms (dangling bonds) in i-type layers to improve the product of mobility and lifetime of carriers in the i-type layers. Hence, they act to compensate interfacial energy levels of the interfaces between p-type layer and i-type layer and between n-type layer and i-type layer, and has the effect of improving photovoltaic force, photoelectric currents and photoresponsitivity of photovoltaic devices.

The hydrogen atoms and/or halogen atoms contained in the i-type layer may be in an amount of from 1 to 40 atom % as an optimum content. In particular, as a preferable form of distribution, the hydrogen atoms and/or halogen atoms may be distributed in a larger content on the side of the interfaces between p-type layer and i-type layer and between n-type layer and i-type layer. In the vicinity of the interfaces, the hydrogen atoms and/or halogen atoms may be contained in an amount 1.05 to 2 times their content in the bulk, as a preferable range. It is also preferable that the content of the hydrogen atoms and/or halogen atoms changes corresponding to the content of silicon atoms.

The amorphous silicon, microcrystalline silicon and amorphous silicon germanium are represented as a-Si:H, a-Si:F, a-Si:H:F, $\mu$c-Si:H, $\mu$c-Si:F, $\mu$c-Si:H:F, a-SiGe:H, a-SiGe:F or a-SiGe:H:F in accordance with the element(s) compensating dangling bonds.

Stated more specifically, as a material for the i-type semiconductor layer 113 of the first pin structure preferred in the photovoltaic device of the present invention, it may include i-type hydrogenated amorphous silicon (a-Si:H), having characteristics such as an optical band gap (Eg) of from 1.60 eV to 1.9 eV, a hydrogen atom content (CH) of from 1.0% to 25.0%, a photoconductivity ($\sigma p$) of $1.0 \times 10^{-5}$ S/cm or above under exposure to artificial sunlight of AM 1.5 and 100 mW/cm$^2$, a dark conductivity ($\sigma d$) of $1.0 \times 10^{-9}$ S/cm or below, an Urback energy of 55 me or below as measured by the constant photocurrent method (CPM), and localized level density of $10^{17}$/cm$^3$ or below. Such a material is preferably used.

p-Type Layer or n-Type Layer

Amorphous materials (herein "a-") and microcrystalline materials (herein "$\mu$c-") of the p-type layers and n-type layers may include, e.g., materials such as a-Si:H, a-Si:HX, a-SiC:H, a-SiC:HX, a-SiGe:H, a-SiGeC:H, a-SiO:H, a-SiN:H, a-SiON:HX, a-SiOCN:HX, $\mu$c-Si:H, $\mu$c-SiC:H, $\mu$c-Si:HX, $\mu$c-SiC:HX, $\mu$c-SiGe:H, $\mu$c-SiO:H, $\mu$c-SiGeC:H, $\mu$c-SiN:H, $\mu$c-SiON:HX and $\mu$c-SiOCN:HX to which a p-type valence electron control agent (Group III atom of the periodic table, B, Al, Ga, In or Tl) or an n-type valence electron control agent (Group V atom of the periodic table, P, As, Sb or Bi) has been added in a high concentration. The polycrystalline materials (herein "poly-") may include materials such as poly-Si:H, poly-Si:HX, poly-SiC:H, poly-SiC:HX, poly-SiGe:H, poly-Si, poly-SiC and poly-SiGe to which a p-type valence electron control agent (Group III atom of the periodic table, B, Al, Ga, In or Tl) or an n-type valence electron control agent (Group V atom of the periodic table, P, As, Sb or Bi) has been added in a high concentration.

A crystalline semiconductor layer having less absorbance or an amorphous semiconductor layer having a broad band gap is suited especially for the p-type layer or n-type layer on the light-incident side.

The addition of the Group III atom of the periodic table to the p-type layer and the addition of the Group V atom of the periodic table to the n-type layer may each be in an amount of from 0.1 to 50 atom % as an optimum amount.

The hydrogen atoms (H,D) or halogen atoms (X) contained in the p-type layers or n-type layers also act to compensate unbonded arms in the p-type layers or n-type layers to improve the doping efficiency of the p-type layers or n-type layers. The hydrogen atoms or halogen atoms may be added to the p-type layers or n-type layers in an amount of from 0.1 to 40 atom % as an optimum amount. Especially when the p-type layers or n-type layers are crystalline, the hydrogen atoms or halogen atoms may be added in an amount of from 0.1 to 8 atom % as an optimum amount. Also, as a preferable form of distribution, the hydrogen atoms and/or halogen atoms may be distributed in a larger content on the side of the interfaces between p-type layer and i-type layer and between n-type layer and i-type layer. In the vicinity of the interfaces, the hydrogen atoms and/or halogen atoms may be contained in an amount 1.05 to 2 times their content in the bulk, as a preferable range. When in this way the content of the hydrogen atoms or halogen atoms is made larger in the vicinity of the interfaces between p-type layer and i-type layer and between n-type layer and i-type layer, any imperfection levels and mechanical strain in the vicinity of the interfaces can be decreased and the photovoltaic force and photoelectric currents of the photovoltaic device of the present invention can be increased.

As electrical characteristics of the p-type layers and n-type layers of the photovoltaic device, the layers may preferably have an activation energy of 0.2 eV or below, and most preferably 0.1 eV or below, and may preferably have a specific resistance of 100 Ω·cm or below, and most preferably 1 Ω·cm or below. The p-type layers and n-type layers may each preferably have a layer thickness of from 1 nm to 50 nm, and most preferably from 3 nm to 10 nm.

Formation of Semiconductor Layers

The Group IV and Groups III–V alloy type amorphous semiconductor layers preferable as the semiconductor layers of the photovoltaic device of the present invention may preferably be formed by microwave plasma-assisted CVD or RF (radio frequency) plasma-assisted CVD.

The microwave plasma-assisted CVD is a process in which material gases such as film-forming gases and dilute gases are fed into a deposition chamber (a vacuum chamber) that can be brought into a vacuum state, the internal pressure of the deposition chamber is kept constant while evacuating it by means of a vacuum pump, and microwaves generated by a microwave power source are guided through a waveguide or a coaxial cable and introduced into the deposition chamber through a conductor (a rod of Ni, W or SUS stainless steel) electrically insulated from the deposition chamber, where plasma of the material gases is caused to take place to carry out decomposition, to thereby form desired deposited films on the substrate placed in the deposition chamber. Thus, deposited films applicable to photovoltaic devices can be formed under broad deposition conditions.

In the case where deposited by microwave plasma-assisted CVD, substrate temperature in the deposition chamber may preferably be set in the range of from 300 to 450° C.; internal pressure, from 0.5 to 50 mTorr; microwave power, from 0.01 to 1 W/cm$^3$; and microwave frequency, from 0.1 to 10 GHz.

In the case where deposited by RF plasma-assisted CVD, substrate temperature in the deposition chamber may preferably be set in the range of from 100 to 350° C.; internal pressure, from 0.1 to 10 Torr; RF power, from 0.01 to 5.0 W/cm$^3$; and deposition rate, from 0.1 to 15 A/sec.

As a deposited-film forming method suited for the formation of the semiconductor layer in the photovoltaic device of the present invention, the roll-to-roll system as disclosed in U.S. Pat. No. 4,400,409 is available.

In this deposited-film forming method, a plurality of glow-discharge regions are arranged along a path successively passing through them, and a belt-like substrate is continuously transported in the longitudinal direction while depositing and forming thereon semiconductor layers with necessary conductivity types in the respective glow-discharge regions. Thus, photovoltaic devices having the desired semiconductor structures can be continuously formed.

The material gases suited for depositing the Group IV and Groups III–V alloy type amorphous semiconductor layers preferable in the photovoltaic device of the present invention may include gasifiable compounds containing silicon atoms, gasifiable compounds containing germanium atoms, gasifiable compounds containing carbon atoms, gasifiable compounds containing nitrogen atoms, gasifiable compounds containing oxygen atoms, and mixed gases of any of these compounds.

Stated specifically, as the gasifiable compounds containing silicon atoms, chain or cyclic silane compounds may be used, specifically including, e.g., gaseous or readily gasifiable compounds such as $SiH_4$, $Si_2H_6$, $SiF_4$, $SiFH_3$, $SiF_2H_2$, $SiF_3H$, $Si_3H8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_5$, $(SiF_2)_5$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$ and $Si_2Cl_3F_3$.

The gasifiable compounds containing germanium atoms may specifically include $GeH_4$, $GeD_4$, $GeF_4$, $GeFH_3$, $GeF_2H_2$, $GeF_3HGeHD_3$, $GeH_2D_2$, $GeH_3D$, $Ge_2H_6$ and $Ge_2D_6$.

The gasifiable compounds containing carbon atoms may specifically include $CH_4$, $CD_4C_nH_{2n+2}$ (n is an integer), $C_nH_{2n}$ (n is an integer), $C_2H_2$, $C_6H_6$, C and CO.

The nitrogen-containing compounds may include $N_2$, $NH_3$, $ND_3$, NO, $NO_2$ and $N_2O$.

The oxygen-containing compounds may include $O_2$, CO, $CO_2$, NO, $NO_2$, $N_2O$, $CH_3CH_2OH$ and $CH_3OH$.

Materials incorporated into the p-type layers or n-type layers in order to control valence electrons may include Group III atoms and Group V atoms of the periodic table.

Materials effectively used as starting materials for incorporating Group III atoms may specifically include, as those for incorporating boron atoms, boron hydrides such as $B_2H_6$, $B_4H_{10}$, $B_5H_9$, $B_5H_{11}$, $B_6H_{10}$, $B_6H_{12}$ and $B_6H_{14}$, and boron halides such as $BF_3$ and $BCl_3$. Besides, the materials may also include $AlCl_3$, $GaCl_3$, $InCl_3$ and $TlCl_3$. $B_2H_6$ and $BF_3$ are particularly suited.

Materials effectively used as starting materials for incorporating Group V atoms may specifically include, as those for incorporating phosphorus atoms, phosphorus hydrides such as $PH_3$ and $P2H_4$ and phosphorus halides such as $PH_4I$, $PF_3$, $PF_5$, $PCl_3$, $PCl_5$, $PBr_3$, $PBr_5$ and $PI_3$. Besides, the materials may also include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$. $PH_3$ and $PF_3$ are particularly suited.

These gasifiable compounds may be fed into the deposition chamber after they are appropriately diluted with a gas such as $H_2$, He, Ne, Ar, Xe or Kr.

Especially when the layers having less absorbance or a broad band gap, such as microcrystalline semiconductor layers and a-SiC:H layers are deposited, the material gases may preferably be diluted to $\frac{1}{2}$ to $\frac{1}{100}$ with hydrogen gas, followed by feeding of microwave power or RF power which may be a relatively high power.

Transparent Electrode

In the present invention, the transparent electrode 115 is a light-transmitting electrode provided on the light-incident side, and also serves as a reflection preventive film when controlled to have an optimum layer thickness. The transparent electrode 115 is required to have a high transmittance in a wavelength region where the semiconductor layers can absorb light, and to have a low resistivity. It may preferably have a transmittance of 80% or above, and more preferably 85% or above, at 550 nm. It may also preferably have a resistivity of $5 \times 10^{-3}$ Ω·cm or below, and more preferably $1 \times 10^{-3}$ Ω·cm or below. As materials therefor, conductive oxides such as $In_2O_3$, $SnO_2$, ITO ($In_2O_3 + SnO_2$), ZnO, CdO, $Cd_2SnO_4$, $TiO_2$, $Ta_2O_5$, $Bi_2O_3$, $MoO_3$ and $Na_xWO_3$ or a mixture of some of these are preferably used. An element capable of changing conductivity (i.e., a dopant) may also be added to these compounds.

As the element capable of changing conductivity (a dopant), Al, In, B, Ga, Si and F are preferably used in the case where the transparent electrode 115 is formed of ZnO; Sn, F, Te, Ti, Sb and Pb, when formed of $In_2O_3$; and F, Sb, P, As, In, Tl, Te, W, Cl, Br and I, when formed of $SnO_2$.

As methods for forming the transparent electrode, vacuum deposition, CVD, spraying, spin-on processing and dipping are preferably used.

Collector Electrode

In the present invention, the collector electrode 116 is optionally provided on part of the transparent electrode 115 when the transparent electrode 115 can not be made to have a sufficiently low resistivity, and acts to decrease the resistivity of the electrode and decrease the series resistance of the photovoltaic device. Materials therefor may include gold, silver, copper, aluminum, nickel, iron, chromium, molybdenum, tungsten, titanium, cobalt, tantalum, niobium and zirconium, alloys such as stainless steel, and conductive pastes making use of powdery metals. As the shape thereof, the electrode is formed in branches so that the light incident on the semiconductor layers is not intercepted as far as possible.

In the whole area of the photovoltaic device, the collector electrode may preferably cover an area of not more than 15%, more preferably not more than 10%, and most preferably not more than 5%.

The pattern of the collector electrode may be formed using a mask and, as methods therefor, by vacuum deposition, sputtering, plating, printing or the like.

When a photovoltaic apparatus having the desired output voltage and output current is manufactured using the photovoltaic device of the present invention, a plurality of photovoltaic devices of the present invention are connected in series or in parallel, protective films are formed on the top surface and the back surface, and electrodes for collecting outputs are attached. In the case where the photovoltaic devices of the present invention are connected in series, diodes for preventing back currents are incorporated in some cases.

EXAMPLES

Examples 1 to 8 are examples in which the i-type semiconductor layer 105 in the bottom cell is formed of amorphous silicon germanium. Examples 9 to 20 are examples in which the i-type semiconductor layer 105 in the bottom cell is microcrystalline silicon germanium.

Example 1

Figure 4:
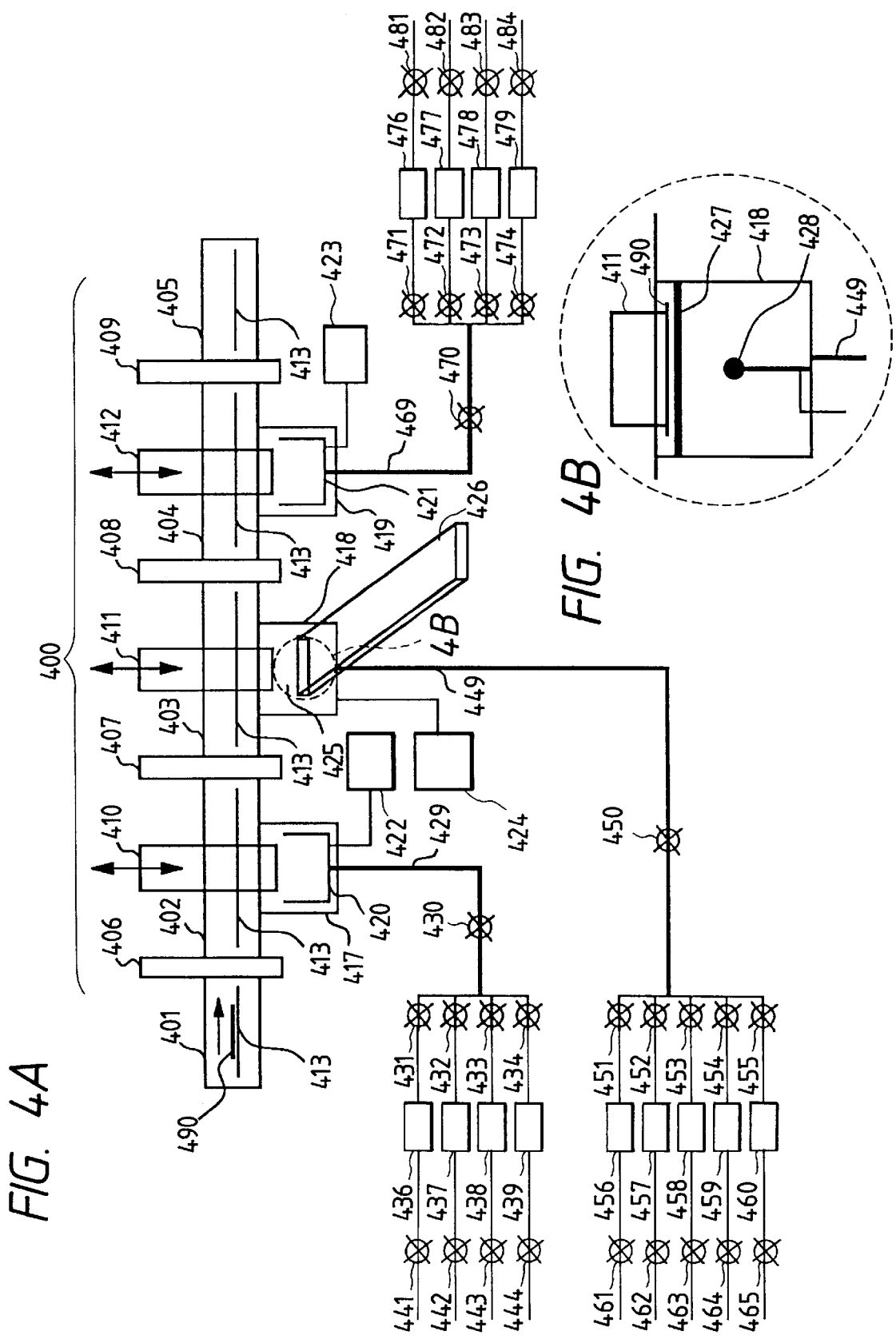
FIG. 4A illustrates a fabrication apparatus suited for continuously fabricating the photovoltaic device of the present invention.
FIG. 4B is an enlarged view of a part thereof.

The photovoltaic device as shown in FIG. 1 was produced using a deposition apparatus shown in FIGS. 4A and 4B.

In FIGS. 4A and 4B, reference numeral 400 denotes, a multiple-chamber separation type deposition apparatus; 401, a load lock chamber (load chamber); 402, an n-type layer (or p-type layer) transport chamber; 403, MW (microwave) or RF i-type semiconductor layer transport chamber; 404, a p-type layer (or n-type layer) transport chamber; 405, an unload chamber; 406, 407, 408 and 409, gate valves; 410, 411 and 412, substrate heaters; 413, substrate transporting rails; 417, an n-type layer (or p-type layer) deposition chamber; 420, an RF-forming cup; 422, an RF power source; 418, an MW or RF i-type semiconductor layer deposition chamber; 425, an MW-introducing window; 426, an MW-introducing waveguide; 427, an MW i-type layer deposition shutter; 428, a bias electrode (bias rod); 424, a bias applying power source; 419, a p-type layer (or n-type layer) deposition chamber; 421, an RF-forming cup; 423, an RF power source; 429, a gas feed pipe, 430, 431, 432, 433, 434, 441, 442, 443 and 444, stop valves, and 436, 437, 438 and 439, mass flow controllers, which constitute an n-type layer (or p-type layer) depositing gas feed system; 449, a gas feed pipe, 450, 451, 452, 453, 454, 455, 461, 462, 463, 464 and 465, stop valves, and 456, 457, 458, 459 and 460, mass flow controllers, which constitute an MW or RF i-type layer depositing gas feed system; and 469, a gas feed pipe, 470, 471, 472, 473, 474, 481, 482, 483 and 484, stop valves, and 476, 477, 478 and 479, mass flow controllers, which constitute a p-type layer (or n-type layer) depositing gas feed system.

The deposition apparatus 400 can carry out both MWPCVD (microwave plasma-assisted chemical vapor deposition) and RFPCVD (radio frequency plasma-assisted chemical vapor deposition). Using this apparatus, the respective semiconductor layers were formed on a substrate 490 having the light-reflecting layers 101 and 102.
(Preparotory setting)

To the deposition apparatus, material gas cylinders (not shown) are connected through gas feed pipes. The material gas cylinders are all purified in an ultra-high purity, and an $SiH_4$ gas cylinder, a $CH_4$ gas cylinder, a $GeH_4$ gas cylinder, an $Si_2H_6$ gas cylinder, a $PH_3/H_2$ (dilution: 2.0%) gas cylinder, a $B_2H_6/H_2$ (dilution: 2.0%) gas cylinder, an $H_2$ gas cylinder, an He gas cylinder, an $SiCl_2H_2$ gas cylinder and an $SiH_4/H_2$ (dilution: 2%) gas cylinder were connected.

Next, the substrate 490, on which a metal layer 101 and a transparent conductive layer 102 had been formed, was placed on the substrate transporting rail 413 provided in the load chamber 401, and the inside of the load chamber 401 was evacuated by means of a vacuum exhaust pump (not shown) to have a pressure of about $1 \times 10^{-5}$ Torr.

Next, the gate valve 406 was opened to carry the substrate into the transport chamber 402 previously evacuated by means of a vacuum exhaust pump (not shown) and then the substrate was pushed down into the deposition chamber 417 by downward moving the substrate heater 410. Subsequently, the substrate 490 was heated in the manner the back thereof was brought into close contact with the substrate heater 410. Then, the inside of the deposition chamber 417 was evacuated by means of a vacuum exhaust pump (not shown) to have a pressure of about $1 \times 10^{-5}$ Torr.

(Formation of RF n-type layer of third pin structure)

$H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.0 Torr. The substrate heater 410 was set so as to bring the temperature of the substrate 490 to 380° C. At the time the substrate temperature became stable, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2.2 sccm, 80 sccm and 10 sccm, respectively, and the pressure inside the deposition chamber 417 was controlled so as to be 1.3 Torr.

Next, the power of the high-frequency (hereinafter "RF") power source 422 was set to 0.05 $W/cm^3$, and RF power was fed to the plasma forming cup 420 to cause glow discharge to take place. Thus, an RF n-type layer of the third pin structure was started to be formed on the substrate, and a layer with a layer thickness of 10 nm was formed, whereupon the RF power source was turned off to stop the glow discharge to complete the formation of an RF n-type layer 103 of the third pin structure. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-4}$ Torr. The substrate heater 410 was returned to the original position, and the substrate 490 (with the layer thus formed) was returned onto the substrate transporting rail 413.

(Formation of i-type layers of third pin structure)

Next, an RF i-type layer 104 (a buffer layer) comprised of a-Si, an MW i-type layer 105 comprised of a-SiGe and an RF i-type layer 106 (a buffer layer) comprised of a-Si, all of the third pin structure, were successively formed in the following way.

First, the gate valve 407 was opened to carry the substrate 490 (with the above layer formed) into the transport chamber 403 and i-type layer deposition chamber 418 previously evacuated by means of a vacuum exhaust pump (not shown). The substrate 490 was heated in the manner the back thereof was brought into close contact with the substrate heater 411. Then, the inside of the i-type layer deposition chamber 418 was evacuated by means of a vacuum exhaust pump (not shown) to have a pressure of about $1 \times 10^{-5}$ Torr.

To form the RF i-type layer 104 of the third pin structure, the substrate heater 411 was set so as to bring the temperature of the substrate 490 to 300° C. At the time the substrate was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3.5 sccm and 100 sccm, respectively. The pressure inside the i-type layer deposition chamber 418 was controlled so as to be 0.65 Torr by adjusting the opening of the conductance valve (not shown).

Next, the power of the RF power source 424 was set to 0.008 $W/cm^3$ and was applied to the bias rod 428 to cause glow discharge to take place, and the shutter 427 was opened. Thus, the i-type layer was started to be formed on the RF n-type layer, and an i-type layer with a layer thickness of 10 nm was formed, whereupon the RF glow discharge was stopped and the output from the RF power source 424 was stopped to complete the formation of the RF i-type layer 104.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

To form the MW i-type layer 105 of the third pin structure, the substrate heater 411 was set so as to bring the temperature of the substrate 490 to 380° C. At the time the substrate was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 48 sccm, 51 sccm and 170 sccm, respectively. The pressure inside the i-type layer deposition chamber 418 was controlled so as to be 10 mTorr by adjusting the opening of the conductance valve (not shown).

The power of the RF power source 424 was set to 0.32 $W/cm^3$, and was applied to the bias rod 428. Thereafter, the power of a microwave power source (2.45 GHz) (not shown) was set to 0.10 $W/cm^3$, and the microwave power was fed into the i-type layer deposition chamber 418 through the waveguide 426 and microwave introducing window 425 to cause glow discharge to take place, and the shutter 427 was opened. Thus, the MW i-type layer of the third pin structure was started to be formed on the RF i-type layer of the third pin structure, and an i-type layer with a layer thickness of 0.17 $\mu$m was formed, whereupon the microwave glow discharge was stopped and the output from the bias power source 424 was stopped to complete the formation of the MW i-type layer 105 of the third pin structure. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1 \times 10^{-5}$ Torr.

The following will be described with reference to an enlarged view (FIG. 4B) of the inside of the i-type layer deposition chamber 418.

To form the RF i-type layer 106 of the third pin structure, the substrate heater 411 was set so as to bring the temperature of the substrate 490 to 300° C. At the time the substrate was well heated, the valves 464, 454, 450, 463 and 453 were slowly opened to flow $Si_2H_6$ gas and $H_2$ gas into the i-type layer deposition chamber 418 through the gas feed pipe 449. Here, Si$_2$H$_6$ gas flow rate and H$_2$ gas flow rate were controlled by means of the corresponding mass flow controllers 459 and 458 so as to be 3.5 sccm and 100 sccm, respectively. The pressure inside the i-type layer deposition chamber 418 was controlled so as to be 0.65 Torr by adjusting the opening of the conductance valve (not shown).

Next, the power of the RF power source 424 was set to 0.008 W/cm$^3$ and was applied to the bias rod 428 to cause glow discharge to take place, and the shutter 427 was opened. Thus, the RF i-type layer of the third pin structure was started to be formed on the MW i-type layer of the third pin structure, and an i-type layer with a layer thickness of 23 nm was formed, whereupon the RF glow discharge was stopped and the output from the RF power source 424 was stopped to complete the formation of the RF i-type layer 106 of the third pin structure. The valves 464, 454, 453 and 450 were closed to stop the Si$_2$H$_6$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

(Formation of RF p-type layer of third pin structure)

To form an RF p-type layer 107 of the third pin structure, comprised of SiC, first the gate valve 408 was opened to carry the substrate 490 (with the above layers formed) into the transport chamber 404 and p-type layer deposition chamber 419 previously evacuated by means of a vacuum exhaust pump (not shown). The substrate 490 was heated in the manner the back thereof was brought into close contact with the substrate heater 412. Then, the inside of the p-type layer deposition chamber 419 was evacuated by means of the vacuum exhaust pump (not shown) to have a pressure of about 1×10$^{-5}$ Torr.

The substrate heater 412 was set so as to bring the temperature of the substrate 490 to 300° C. At the time the substrate temperature became stable, the valves 481, 471, 470, 482, 472, 483, 473, 484 and 474 were operated to feed H$_2$ gas, SiH$_4$/H$_2$ gas, B$_2$H$_6$/H$_2$ gas and CH$_4$ gas into the deposition chamber 419 through the gas feed pipe 469. Here, H$_2$ gas flow rate, SiH$_4$/H$_2$ gas flow rate, B$_2$H$_6$/H$_2$ gas flow rate and CH$_4$ gas flow rate were controlled by means of the mass flow controllers 476, 477, 478 and 479 so as to be 80 sccm, 3 sccm, 9 sccm and 0.1 sccm, respectively, and the pressure inside the deposition chamber 419 was controlled so as to be 1.8 Torr by adjusting the opening of the conductance valve (not shown).

Next, the power of the RF power source 423 was set to 0.07 W/cm$^3$, and RF power was fed to the plasma forming cup 421 to cause glow discharge to take place. Thus, the RF p-type layer of the third pin structure was started to be formed on the i-type layer, and an RF p-type layer with a layer thickness of 10 nm was formed, whereupon the RF power source was turned off to stop the glow discharge to complete the formation of the RF p-type layer 107 of the third pin structure. The valves 472, 482, 473, 483, 474, 484, 471, 481 and 470 were closed to stop the SiH$_4$/H$_2$ gas, B$_2$H$_6$/H$_2$ gas, CH$_4$ gas and H$_2$ gas from flowing into the p-type layer deposition chamber 419, and then the inside of the p-type layer deposition chamber 419 and the inside of the gas pipe were evacuated to have a pressure of 1×10$^{-5}$ Torr.

(Formation of RF n-type layer of second pin structure)

To form an RF n-type layer 109 of the second pin structure, comprised of μc-Si, the gate valve 408 was opened to carry the substrate 490 (with the above layers formed) into the transport chamber 403 previously evacuated by means of a vacuum exhaust pump (not shown), and the gate valve 407 was also opened to carry the substrate 490 into the transport chamber 402 and n-type layer deposition chamber 417 previously evacuated by means of a vacuum exhaust pump (not shown).

The substrate 490 was heated in the manner the back thereof was brought into close contact with the substrate heater 410. Then, the inside of the n-type layer deposition chamber 417 was evacuated by means of a vacuum exhaust pump (not shown) to have a pressure of about 1×10$^{-5}$ Torr.

The substrate heater 410 was set so as to bring the temperature of the substrate 490 to 320° C. At the time the substrate temperature became stable, the valves 443, 433, 444 and 434 were operated to feed SiH$_4$ gas and PH$_3$/H$_2$ gas into the deposition chamber 417 through the gas feed pipe 429. Here, SiH$_4$ gas flow rate, H$_2$ gas flow rate and PH$_3$/H$_2$ gas flow rate were controlled by means of the mass flow controllers 438, 436 and 439 so as to be 1 sccm, 150 sccm and 8 sccm, respectively, and the pressure inside the deposition chamber 417 was controlled so as to be 1.2 Torr.

Next, the power of the RF power source 422 was set to 0.07 W/cm$^3$, and RF power was fed to the plasma forming cup 420 to cause glow discharge to take place. Thus, an RF n-type layer of the second pin structure was started to be formed on the RF p-type layer of the third pin structure, and an RF n-type layer with a layer thickness of 100 nm was formed, whereupon the RF power source was turned off to stop the glow discharge to complete the formation of an RF n-type layer 109 of the second pin structure. The SiH$_4$ gas, PH$_3$/H$_2$ gas and H$_2$ gas were stopped from flowing into the deposition chamber 417, and then the inside of the deposition chamber and the inside of the gas pipe were evacuated to have a pressure of 1×10$^{-5}$ Torr.

(Formation of i-type layer of second pin structure)

To form an i-type layer 110 of the second pin structure, comprised of μc-Si, the gate valve 407 was opened to carry the substrate 490 (with the above layers formed) into the transport chamber 403 and i-type layer deposition chamber 418 previously evacuated by means of a vacuum exhaust pump (not shown).

The substrate heater 411 was set so as to bring the temperature of the substrate 490 to 380° C. At the time the substrate was well heated, the valves 461, 451, 450, 462, 452, 463 and 453 were slowly opened to flow SiH$_4$ gas and H$_2$ gas into the i-type layer deposition chamber 418 through the gas feed pipe 449. Here, SiH$_4$ gas flow rate and H$_2$ gas flow rate were controlled by means of the corresponding mass flow controllers 456 and 458 so as to be 50 sccm and 1,500 sccm, respectively. The pressure inside the i-type layer deposition chamber 418 was controlled so as to be 0.03 Torr by adjusting the opening of the conductance valve (not shown).

Next, the power of the RF power source 424 was set to 0.15 W/cm$^3$, and was applied to the bias rod 428. Thereafter, the power of a microwave power source (0.5 GHz) (not shown) was set to 0.10 W/cm$^3$, and the microwave power was fed into the i-type layer deposition chamber 418 through the bias rod 428 to cause glow discharge to take place. Thus, the i-type layer of the second pin structure was started to be formed on the RF n-type layer of the second pin structure, and a layer with a layer thickness of 1.5 μm was formed, whereupon the glow discharge was stopped and the output from the bias power source 424 was stopped to complete the formation of the i-type layer 110 of the second pin structure. The valves 451 and 453 were closed to stop the SiH$_4$ gas and H$_2$ gas from flowing into the i-type layer deposition chamber 418, and then the inside of the i-type layer deposition chamber 418 and the inside of the gas pipe were evacuated to have a pressure of 1×10$^{-5}$ Torr.

(Formation of RF p-type layer of second pin structure)

To form an RF p-type layer 111 of the second pin structure, comprised of SiC, the substrate 490 (with the above layers formed) was carried in the same manner as the formation of the RF p-type layer 107 of the third pin structure. The subsequent procedure for the RF p-type layer of the third pin structure was repeated except that the $H_2$ gas flow rate, $SiH_4/H_2$ gas flow rate, $B_2H_6/H_2$ gas flow rate and $CH_4$ gas flow rate were controlled by means of the mass flow controllers so as to be 80 sccm, 3 sccm, 9 sccm and 0.2 sccm, respectively, and the deposition was carries out at a substrate temperature of 260° C.

(Formation of RF n-type layer of first pin structure)

To form an RF n-type layer 112 of the first pin structure, comprised of a-Si, first the gate valve 408 was opened to carry the substrate 490 (with the above layers formed) into the transport chamber 403 previously evacuated by means of a vacuum exhaust pump (not shown), and the gate valve 407 was also opened to carry the substrate 490 into the transport chamber 402 and n-type layer deposition chamber 417 previously evacuated by means of a vacuum exhaust pump (not shown).

The subsequent procedure for the RF n-type layer of the second pin structure was repeated except that the $SiH_4$ gas flow rate, $H_2$ gas flow rate and $PH_3/H_2$ gas flow rate were controlled by means of the mass flow controllers 438, 436 and 439 so as to be 1.1 sccm, 50 sccm and 10 sccm, respectively, the pressure inside the deposition chamber 417 was controlled so as to be 1.05 Torr, and the substrate heater 410 was set so as to bring the temperature of the substrate 490 to 230° C. Thus, the RF n-type layer 112 of the first pin structure was formed.

(Formation of RF i-type layer of first pin structure)

To form an RF i-type layer 113 of the first pin structure, comprised of a-Si, the substrate 490 (with the above layers formed) was carried in the same manner as the formation of the RF i-type layer 104 of the third pin structure. The subsequent procedure for the RF i-type layer 104 of the third pin structure was repeated except that the substrate temperature was set to 190° C., the $Si_2H_6$ gas flow rate and $H_2$ gas flow rate were controlled by means of the corresponding mass flow controllers 464 and 463 so as to be 2 sccm and 200 sccm, respectively, the pressure inside the deposition chamber 417 was controlled so as to be 0.8 Torr, and the RF power was set to 0.007 W/cm³. Thus, an RF i-type layer 113 with a layer thickness of 0.09 µm was formed.

(Formation of RF p-type layer of first pin structure)

To form an RF p-type layer 114 of the first pin structure, comprised of SiC, the substrate 490 (with the above layers formed) was carried in the same manner as the formation of the RF p-type layer 107 of the third pin structure. The subsequent procedure for the RF p-type layer of the third pin structure was repeated except that the $H_2$ gas flow rate, $SiH_4/H_2$ gas flow rate, $B_2H_6/H_2$ gas flow rate and $CH_4$ gas flow rate were controlled by means of the mass flow controllers so as to be 90 sccm, 3 sccm, 8 sccm and 0.4 sccm, respectively, and the deposition was carried out at a substrate temperature of 170° C.

Next, the gate valve 409 was opened to carry the substrate 490 (with the above layers formed) into the unload chamber 405 previously evacuated by means of a vacuum exhaust pump (not shown), and a leak valve (not shown) was opened to let gases escape from the unload chamber 405.

(Transparent conductive layer and collector electrode)

Next, on the RF p-type layer 114 of the first pin structure, ITO was deposited by vacuum deposition in a layer thickness of 70 nm as the transparent electrode 115.

Next, on the transparent electrode 115, a mask with a comb-shaped opening was placed, and the comb-shaped collector electrode 116 comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCEx-1.

Comparative Example 1-1

In Example 1, the n-type layer of the third pin structure was formed to have a-Si, the i-type layer of the third pin structure a-SiGe, the n-type layer of the second pin structure a-Si and the i-type layer of the second pin structure a-Si, which were all formed using RF power. Thus, a photovoltaic device SCCp-1-1 was produced. The p-type, i-type and n-type layers other than the above were formed in the same manner as in Example 1.

Gas flow rates and other conditions are shown in Table 5.

For each of the photovoltaic devices SCEx-1 and SCCp-1-1, five samples were prepared, and their initial photoelectric conversion efficiency, short-circuit current, loss of efficiency with respect to initial efficiency under exposure to light of AM 1.5 (100 mW/cm²) at 35° C. for 2,000 hours (hereinafter "rate of photo-deterioration", efficiency after leaving in the dark at 85° C. and a humidity of 80% RH for 2,000 hours (hereinafter "rate of heat resistance deterioration"), cell withstand voltage, and yield were measured. The initial photoelectric conversion efficiency is determined by setting the resultant photovoltaic devices under exposure to light of AM 1.5 (100 mW/cm²) to measure V-I characteristics. As the result of measurement, the characteristics of SCCp-1-1 on the basis of those of SCEx-1 assumed as 1 were as follows: Initial photoelectric conversion efficiency: 0.89 time; short-circuit current: 0.92 time, rate of photo-deterioration: 1.08 times; rate of heat resistance deterioration: 1.15 times; cell withstand voltage: 0.94 time; and yield: 0.94 time.

The device in which only the middle cell i-type layer among all i-type layers is microcrystalline is seen to have better characteristics than the one in which all the i-type layers are amorphous.

Comparative Example 1-2

The procedure of Example 1 was repeated except that the MW i-type semiconductor layer 105 of the third pin structure, comprised of amorphous silicon germanium, was formed using only RF power, $SiH_4$ gas flow rate, $GeH_4$ gas flow rate and $H_2$ gas flow rate were controlled by means of the corresponding mass flow controllers 456, 457 and 458 so as to be 4 sccm, 3 sccm and 200 sccm, respectively, and the pressure inside the i-type layer deposition chamber 418 was controlled so as to be 0.8 Torr, thus, an RF i-type semiconductor layer with a layer thickness of 0.1 µm was formed.

As the result of measurement similarly made, the characteristics of SCCp-1-2 on the basis of those of SCEx-1 assumed as 1 were as follows: Initial photoelectric conversion efficiency: 0.92 time; rate of photo-deterioration: 1.05 times; rate of heat resistance deterioration: 1.13 times; cell withstand voltage: 0.96 time; and yield: 0.98 time.

As shown above, compared with the film formation carried out using only RF power, the film formation carried out using microwave power brought about an increase in the rate of film formation and enabled high-temperature film formation, and hence also brought about an increase in the mobility of precursors to yield films with a good quality.

Better results were also obtained in respect of the rate of photo-deterioration, compared with the film formed using only RF power.

Example 2

In Example 1, the i-type semiconductor layer of the second pin structure, comprised of μc-Si, was formed in the following way, using a microwave power source (2.45 GHz) in place of the microwave power source (0.5 GHz).

The substrate heater 411 was set so as to bring the temperature of the substrate 490 to 380° C. At the time the substrate was well heated, the valves 461, 451, 450, 462, 452, 463 and 453 were slowly opened to flow $SiH_4$ gas and $H_2$ gas into the i-type layer deposition chamber 418 through the gas feed pipe 449. Here, $SiH_4$ gas flow rate and $H_2$ gas flow rate were controlled by means of the corresponding mass flow controllers 456 and 458 so as to be 25 sccm and 500 sccm, respectively. The pressure inside the i-type layer deposition chamber 418 was controlled so as to be 0.02 Torr by adjusting the opening of the conductance valve (not shown).

Next, the power of the RF power source 424 was set to 0.15 W/cm³, and was applied to the bias rod 428. Thereafter, the power of a microwave power source (2.45 GHz) (not shown) was set to 0.10 W/cm³, and the microwave power was fed into the i-type layer deposition chamber 418 through the bias rod 428 to cause glow discharge to take place. Thus, the i-type layer of the second pin structure was started to be formed on the RF n-type layer of the second pin structure, and an i-type with a layer thickness of 0.5 μm was formed, whereupon the glow discharge was stopped and the output from the bias power source 424 was stopped to complete the formation of the i-type layer 110 of the second pin structure. The valves 451 and 453 were closed to stop the $SiH_4$ gas and $H_2$ gas from flowing into the i-type layer deposition chamber 418, and then the inside of the i-type layer deposition chamber 418 and the inside of the gas pipe were evacuated to have a pressure of 1×10⁻⁵ Torr.

A photovoltaic device thus obtained is called SCEx-2. Gas flow rates and other conditions are shown in Table 6.

Comparative Example 2

In Example 2, the n-type layer of the third pin structure was formed to have a-Si, the i-type layer of the third pin structure a-SiGe, the n-type layer of the second pin structure a-Si, and the i-type layer of the second pin structure a-Si, which were all formed using RF power. Thus, a photovoltaic device SCCp-2 was produced. The p-type, i-type and n-type layers other than the above were formed in the same manner as in Example 1.

Gas flow rates and other conditions are shown in Table 7.

For each of the photovoltaic devices SCEx-2 and SCCp-2, four samples were prepared, and their initial photoelectric conversion efficiency, short-circuit current, rate of photo-deterioration, rate of heat resistance deterioration, cell withstand voltage, and yield were measured.

As the result of measurement, the characteristics of SCCp-2 on the basis of those of SCEx-2 assumed as 1 were as follows: Initial photoelectric conversion efficiency: 0.89 time; short-circuit current: 0.94 time, rate of photo-deterioration: 1.12 times; rate of heat resistance deterioration: 1.13 times; cell withstand voltage: 0.95 time; and yield: 0.93 time.

The photovoltaic device of the present invention is seen to have superior characteristics.

Example 3

In Example 1, the i-type layer 110 of the second pin structure, comprised of μc-Si, was formed at gas flow rates changed as shown below.

$SiH_4$ gas flow rate and $H_2$ gas flow rate were controlled by means of the corresponding mass flow controllers 456 and 458 so as to be 50 sccm and 1,500 sccm, respectively. The pressure inside the i-type layer deposition chamber 418 was controlled so as to be 0.03 Torr by adjusting the opening of the conductance valve (not shown). Next, the power of the RF power source 424 was set to 0.15 W/cm³, and was applied to the bias rod 428. Thereafter, the power of a microwave power source (0.5 GHz) (not shown) was set to 0.1 W/cm³, and the microwave power was fed into the i-type layer deposition chamber 418 through the bias rod 428 to cause glow discharge to take place. Thus, the i-type layer of the second pin structure was started to be formed on the RF n-type layer of the second pin structure, and an i-type with a layer thickness of 1.0 μm was formed, whereupon the glow discharge was stopped and the output from the bias power source 424 was stopped to complete the formation of the i-type layer 110 of the second pin structure. In the same way, eight samples were prepared in which only the layer thickness of the i-type layer 110 of the second pin structure, comprised of μc-Si, was changed in the range of from 0.1 μm to 2.5 μm, and their initial photoelectric conversion efficiency, short-circuit current, open current voltage, fill factor, rate of photo-deterioration, and yield were measured.

Results obtained are shown in Table 1.

In respect of the initial photoelectric conversion efficiency, devices exhibiting superior characteristics were obtained when the i-type layer 110 of the second pin structure, comprised of μc-Si, was formed in a layer thickness of from 0.3 μm to 2.2 μm. The fill factor showed a tendency to decrease with an increase in layer thickness of the i-type layer 110 of the second pin structure, and the rate of photo-deterioration showed a tendency to increase with an increase in layer thickness of the i-type layer 110 of the second pin structure. With regard to the short-circuit current, open current voltage and yield, good results were shown with an increase in layer thickness of the i-type layer 110 of the second pin structure.

Example 4

In Example 1, the n-type layer 109 of the second pin structure was formed in the same way and the i-type layer 110 of the second pin structure, comprised of μc-Si, was formed at gas flow rates changed as shown below.

$SiH_4$ gas flow rate and $H_2$ gas flow rate were controlled by means of the corresponding mass flow controllers 456 and 458 so as to be 50 sccm and 1,500 sccm, respectively, and $B_2H_6/H_2$ gas flow rate was controlled by means of the mass flow controller 460 so that boron content in microcrystalline silicon of the i-type layer 110 of the second pin structure ranged from 0 ppm to 10.0 ppm, thus photovoltaic devices were produced. The other p-type, i-type and n-type layers were formed in the same manner as in Example 1. The boron content in the i-type layer 110 of the second pin structure was measured using IMF-4F (Trade name), manufactured by CAMECA Co. Results obtained are shown in Table 2.

Good-quality i-type layers having superior initial photoelectric conversion efficiency, stabilized photoelectric conversion efficiency, rate of photo-deterioration and yield after heat deterioration were obtained when the i-type layer 110 of the second pin structure had a boron content in silicon of 8.0 ppm or less.

Example 5

In Example 1, the MW i-type layer 105 of the third pin structure was formed at gas flow rates changed as shown below.

SiH$_4$ gas flow rate and H$_2$ gas flow rate were controlled by means of the corresponding mass flow controllers 456 and 458 so as to be 50 sccm and 150 sccm, respectively, and GeH$_4$ gas flow rate was controlled by means of the mass flow controller 457 so as to increase in the course of the film formation. The other p-type, i-type and n-type layers were formed in the same manner as in Example 1.

Results obtained are shown in Tables 3 and 4.

When the germanium content in amorphous silicon germanium of the i-type semiconductor layer is in a content of 45 atom % or more, without regard to whether the GeH$_4$ gas flow rate was constant or gradient, the i-type layer of the third pin structure had a band gap suited for absorbing long-wavelength light in the photovoltaic device of the present invention and sufficient electric currents were obtained in the third pin structure, thus improvements in efficiency were seen as a whole.

Example 6

A photovoltaic device SCEx-6 was produced in which the n-type semiconductor layer of the second pin structure in Example 1 was changed to have a laminated structure as shown in FIG. 2, comprised of an amorphous semiconductor and a microcrystalline semiconductor. In FIG. 2, reference numeral 208 denotes an n-type amorphous semiconductor (a-Si) layer and 209 an n-type microcrystalline semiconductor ($\mu$c-Si) layer.

To form the RF n-type layer 208 comprised of a-Si, after a p-type semiconductor layer 207 of the third pin structure was formed, the valves 443, 433, 444 and 434 were operated to feed SiH$_4$ gas and PH$_3$/H$_2$ gas into the deposition chamber 417 through the gas feed pipe 429. Here, SiH$_4$ gas flow rate, H$_2$ gas flow rate and PH$_3$/H$_2$ gas flow rate were controlled by means of the mass flow controllers 438, 436 and 439 so as to be 2 sccm, 100 sccm and 5 sccm, respectively, and the pressure inside the deposition chamber 417 was controlled so as to be 1.0 Torr.

Next, the power of the RF power source 422 was set to 0.03 W/cm$^3$, and RF power was fed to the plasma forming cup 420 to cause glow discharge to take place. Thus, an RF n-type layer of the second pin structure was started to be formed on the p-type layer 207 of the third pin structure, and an RF n-type layer with a layer thickness of 20 nm was formed, whereupon the RF power source was turned off to stop the glow discharge to complete the formation of the RF n-type layer 208 of the second pin structure. The SiH$_4$ gas, PH$_3$/H$_2$ gas and H$_2$ gas were stopped from flowing into the deposition chamber 417, and then the inside of the deposition chamber and the inside of the gas pipe were evacuated to have a pressure of 1×10$^{-5}$ Torr.

The other deposited layers were formed in the same manner as in Example 1.

Comparative Example 3

In Example 1, the RF n-type layer of the second pin structure was formed to have a-Si, and the i-type layer of the second pin structure a-Si, thus a photovoltaic device SCCp-3 was produced. The p-type, i-type and n-type layers other than the above were formed in the same manner as in Example 1.

For each of the photovoltaic devices SCEx-6 and SCCp-3, six samples were prepared, and their initial photoelectric conversion efficiency, short-circuit current, rate of photo-deterioration, rate of heat resistance deterioration, cell withstand voltage, and yield were measured.

As the result of measurement, the characteristics of SCCp-3 on the basis of those of SCEx-6 assumed as 1 were as follows: Initial photoelectric conversion efficiency: 0.93 time; short-circuit current: 0.93 time, rate of photo-deterioration: 1.08 times; rate of heat resistance deterioration: 1.13 times; cell withstand voltage: 0.96 time; and yield: 0.94 time.

The photovoltaic device of the present invention is seen to have superior characteristics.

Example 7

Figure 5:
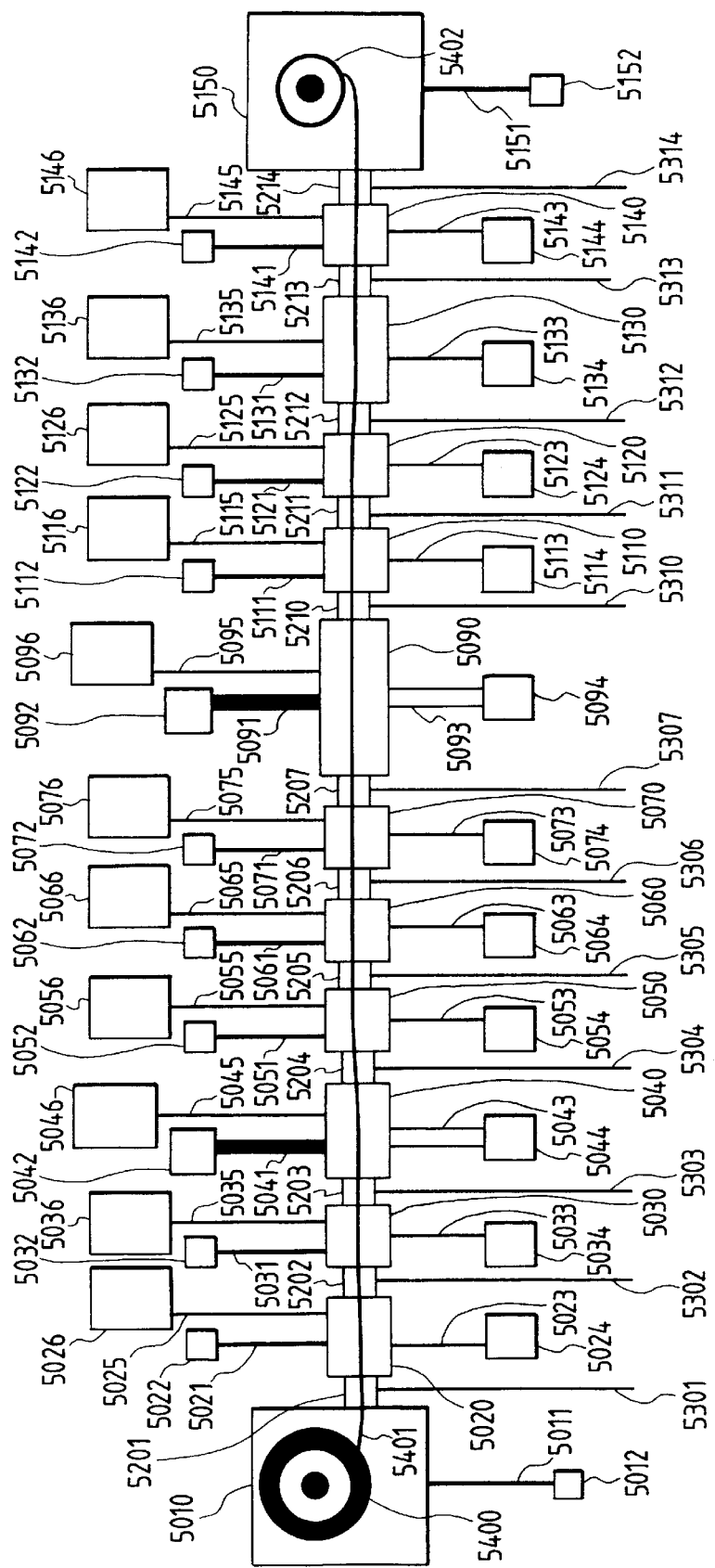
FIG. 5 illustrates another fabrication apparatus suited for continuously fabricating the photovoltaic device of the present invention on a continuous-sheet substrate.

The triple type photovoltaic device as shown in FIG. 1 was produced using a deposition apparatus employing a roll-to-roll system as shown in FIG. 5.

In FIG. 5, reference numeral 5010 denotes a load chamber for feeding sheet-like substrate; 5011, an exhaust pipe; 5012, an exhaust pump; 5201, a gas gate; 5301, a gas feed pipe to the gas gate; 5020, a deposition chamber for a p-type layer of the third pin structure; 5021, an exhaust pipe; 5022, an exhaust pump; 5023, a coaxial cable for RF power supply; 5024, an RF power source; 5025, a material gas feed pipe; 5026, a mixing system; 5202, a gas gate; 5302, a gas feed pipe to the gas gate; 5030, a deposition chamber for an RF i-type semiconductor layer (n/i) of the third pin structure; 5031, an exhaust pipe; 5032, an exhaust pump; 5033, a coaxial cable for RF power supply; 5034, an RF power source; 5035, a material gas feed pipe; 5036, a mixing system; 5203, a gas gate; 5303, a gas feed pipe to the gas gate; 5040, a deposition chamber for an MW i-type semiconductor layer of the third pin structure; 5041, an exhaust pipe; 5042, an exhaust pump (with a diffusion pump); 5043, an MW-introducing waveguide; 5044, an MW power source; 5045, a material gas feed pipe; 5046, a mixing system; 5204, a gas gate; 5304, a gas feed pipe to the gas gate; 5050, a deposition chamber for an RF i-type semiconductor layer (p/i) of the third pin structure; 5051, an exhaust pipe; 5052, an exhaust pump; 5053, a coaxial cable for RF power supply; 5054, an RF power source; 5055, a material gas feed pipe; 5056, a mixing system; 5205, a gas gate; 5305, a gas feed pipe to the gas gate; 5060, a deposition chamber for a p-type semiconductor layer of the third pin structure; 5061, an exhaust pipe; 5062, an exhaust pump; 5063, a coaxial cable for RF power supply; 5064, an RF power source; 5065, a material gas feed pipe; 5066, a mixing system; 5206, a gas gate; 5306, a gas feed pipe to the gas gate; 5070, a deposition chamber for an n-type semiconductor layer of the second pin structure; 5071, an exhaust pipe; 5072, an exhaust pump; 5073, a coaxial cable for RF power supply; 5074, an RF power source; 5075, a material gas feed pipe; 5076, a mixing system; 5207, a gas gate; 5307, a gas feed pipe to the gas gate; 5090, a deposition chamber for an MW i-type semiconductor layer of the second pin structure; 5091, an exhaust pipe; 5092, an exhaust pump (with a diffusion pump); 5093, an MW-introducing waveguide; 5094, an MW power source; 5095, a material gas feed pipe; 5096, a mixing system; 5210, a gas gate; 5310, a gas feed pipe to the gas gate; 5110, a deposition chamber for a p-type semiconductor layer of the second pin structure; 5111, an exhaust pipe; 5112, an exhaust pump; 5113, a coaxial cable for RF power supply; 5114, an RF power source; 5115, a material gas feed pipe; 5116, a mixing system; 5211, a gas gate; 5311, a gas feed pipe to the gas gate; 5120, a deposition chamber for an n-type semiconductor layer of the first pin structure; 5121, an exhaust pipe; 5122, an exhaust pump; 5123, a coaxial cable for RF power supply; 5124, an RF power source; 5125, a material gas feed pipe; 5126, a mixing system; 5212, a gas gate; 5312, a gas feed pipe to the gas gate; 5130, a deposition chamber for an RF i-type semiconductor layer of the first pin structure; 5131, an exhaust pipe; 5132, an exhaust pump; 5133, a coaxial cable for RF power supply; 5134, an RF power source; 5135, a material gas feed pipe; 5136, a mixing system; 5213, a gas gate; 5313, a gas feed pipe to the gas gate; 5140, a deposition chamber for a p-type semiconductor layer of the first pin structure; 5141, an exhaust pipe; 5142, an exhaust pump; 5143, a coaxial cable for RF power supply; 5144, an RF power source; 5145, a material gas feed pipe; 5146, a mixing system; 5214, a gas gate; 5314, a gas feed pipe to the gas gate; 5150, an unload chamber; 5151, an exhaust pipe; 5152, an exhaust pump; 5400, the substrate wound up in a role; and 5402, a wind-up jig.

As the substrate, a sheet-like substrate of 300 m long, 30 cm wide and 0.2 mm thick on which a metal layer and a transparent conductive layer were previously formed was used. Conditions for forming semiconductor layers are shown in Table 8.

The sheet-like substrate having light-reflecting layers (the metal layer and the transparent conductive layer) was set in the load chamber 5010 for feeding the substrate. This sheet-like substrate was passed through all the deposition chambers and all the gas gates and connected to the sheet wind-up jig in the unload chamber 5150. The respective deposition chambers were evacuated to $10^{-3}$ Torr or below by means of exhaust systems (not shown). The desired materials gases were fed into the respective deposition chambers from the deposited film forming mixing systems 5026, 5036, 5046, 5056, 5066, 5076, 5096, 5116, 5126, 5136 and 5146. To the gas gates 5201, 5202, 5203, 5204, 5205, 5206, 5207, 5210, 5211, 5212, 5213 and 5214, gas was fed from the respective gate gas feeding system.

The substrate was heated by means of the substrate heater in each deposition system, and the degree of vacuum was controlled by adjusting the opening of the exhaust valve of each exhaust system. After the substrate temperature and degree of vacuum became stable, the substrate was started to be transported, and RF power or MW (frequency: 0.5 GHz, 2.45 GHz) power for generating plasma was supplied to each deposition chamber. In this way, the triple type photovoltaic device having the three pin structures superposed as shown in FIG. 1, was formed on the sheet-like substrate over a length of 100 m. In the formation of the i-type semiconductor layer of the second pin structure, microwave power (0.5 GHz) was applied.

Next, on the RF p-type layer 114, ITO was deposited by vacuum deposition in a layer thickness of 70 nm as the transparent electrode 115. On the transparent electrode 115, a mask with a comb-shaped opening was placed, and the comb-shaped collector electrode 116 comprised of Cr(40 nm)/Ag(1,000 nm)/Cr(40 nm) was deposited by vacuum deposition. Thus, the fabrication of a photovoltaic device (SCEx-7) of the present Example was completed.

This photovoltaic device has superior characteristics like the devices of Examples previously described, and also promises a very high productivity.

Comparative Example 4

A photovoltaic device SCCp-4 was produced by the above roll-to-roll system under the same conditions as Example 7 except that the RF n-type layer of the second pin structure was formed to have a-Si, and the i-type layer of the second pin structure a-Si.

As the result of measurement, the characteristics of SCCp-4 on the basis of those of SCEx-7 assumed as 1 were as follows: Initial photoelectric conversion efficiency: 0.93 time; short-circuit current: 0.92 time, rate of photo-deterioration: 1.09 times; rate of heat resistance deterioration: 1.12 times; cell withstand voltage: 0.97 time; and yield: 0.92 time.

The photovoltaic device of the present invention is seen to have superior characteristics.

Example 8

In Example 7, the i-type semiconductor layer of the second pin structure was formed using a microwave power (2.45 GHz) in place of the microwave power (0.5 GHz), and the triple type photovoltaic device as shown in FIG. 1 was produced using the deposition apparatus employing a roll-to-roll system as shown in FIG. 5. This photovoltaic device, SCEx-8, has superior characteristics like the devices of Examples previously described, and also has a very high productivity. This device was compared with that of Comparative Example 4 to obtain the results shown below.

As the result of measurement, the characteristics of SCCp-4 on the basis of those of SCEx-8 assumed as 1 were as follows: Initial photoelectric conversion efficiency: 0.89 time; short-circuit current: 0.95 time, rate of photo-deterioration: 1.09 times; rate of heat resistance deterioration: 1.08 times; cell withstand voltage: 0.96 time; and yield: 0.95 time.

The photovoltaic device of the present invention is seen to have superior characteristics.

Example 9

The photovoltaic device as shown in FIG. 1 was produced using the deposition apparatus shown in FIGS. 4A and 4B. In the present Example, the layer 105 was formed of microcrystalline silicon germanium, and the buffer layer 104 was not provided.

The deposition apparatus 400 can carry out both MWPCVD and RFPCVD. Using this apparatus, the respective semiconductor layers were formed on the substrate 490 having the light-reflecting layers 101 and 102.

(Preparatory Setting)

To the deposition apparatus, material gas cylinders (not shown) are connected through gas feed pipes. The material gas cylinders are all purified in an ultra-high purity, and an $SiH_4$ gas cylinder, a $CH_4$ gas cylinder, a $GeH_4$ gas cylinder, an $Si_2H_6$ gas cylinder, a $PH_3/H_2$ (dilution: 2.0%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 2%) gas cylinder were connected.

Next, the substrate 490, on which the light-reflecting layers 101 and 102 had been formed, was placed on the substrate transporting rail 413 provided in the load chamber 401, and the inside of the load chamber 401 was evacuated by means of a vacuum exhaust pump (not shown) to have a pressure of about $1 \times 10^{-5}$ Torr.

Next, the gate valve 406 was opened to carry the substrate into the transport chamber 402 previously evacuated by means of a vacuum exhaust pump (not shown) and then the substrate was pushed down into the deposition chamber 417 by downward moving the substrate heater 410. Subsequently, the substrate 490 was heated in the manner the back thereof was brought into close contact with the substrate heater 410. Then, the inside of the deposition chamber 417 was evacuated by means of a vacuum exhaust pump (not shown) to have a pressure of about $1\times10^{-5}$ Torr.
(Formation of RF n-type layer of third pin structure)

$H_2$ gas was fed into the deposition chamber 417 through the gas feed pipe 429. Then, the valves 441, 431 and 430 were opened, and $H_2$ gas flow rate was controlled by means of the mass flow controller 436 so as to be 300 sccm. The pressure inside the deposition chamber 417 was controlled by means of a conductance valve (not shown) so as to be 1.0 Torr. The substrate heater 410 was set so as to bring the temperature of the substrate 490 to 380° C. At the time the substrate temperature became stable, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow-.controllers 438, 436 and 439 so as to be 1.2 sccm, 150 sccm and 8 sccm, respectively, and the pressure inside the deposition chamber 417 was controlled so as to be 1.3 Torr.

Next, the power of the high-frequency (hereinafter "RF") power source 422 was set to 0.07 $W/cm^3$, and RF power was fed to the plasma forming cup 420 to cause glow discharge to take place. Thus, an RF n-type layer of the third pin structure was started to be formed on the substrate, and an RF n-type layer with a layer thickness of 0.1 $\mu m$ was formed, whereupon the RF power source was turned off to stop the glow discharge to complete the formation of an RF n-type layer 103 of the third pin structure, comprised of $\mu c$-Si. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.
(Formation of i-type layers of third pin structure)

Next, an MW i-type layer 105 comprised of $\mu c$-SiGe and an RF i-type layer 106 (a buffer layer) comprised of a-Si, both of the third pin structure, were successively formed in the following way.

First, the gate valve 407 was opened to carry the substrate 490 (with the above layer formed) into the transport chamber 403 and i-type layer deposition chamber 418 previously evacuated by means of a vacuum exhaust pump (not shown). The substrate 490 was heated in the manner the back thereof was brought into close contact with the substrate heater 411. Then, the inside of the i-type layer deposition chamber 418 was evacuated by means of a vacuum exhaust pump (not shown) to have a pressure of about $1\times10^{-5}$ Torr.

To form the MW i-type layer 105 of the third pin structure, the substrate heater 411 was set so as to bring the temperature of the substrate 490 to 420° C. At the time the substrate was well heated, the valves 461, 451, 450, 462, 452, 463 and 453 were slowly opened to flow $SiH_4$ gas, $GeH_4$ gas and $H_2$ gas into the i-type layer deposition chamber 418 through the gas feed pipe 449. Here, $SiH_4$ gas flow rate, $GeH_4$ gas flow rate and $H_2$ gas flow rate were controlled by means of the corresponding mass flow controllers 456, 457 and 458 so as to be 40 sccm, 40 sccm and 1,500 sccm, respectively. The pressure inside the i-type layer deposition chamber 418 was controlled so as to be 30 mTorr by adjusting the opening of the conductance valve (not shown).

Next, the power of the RF power source 424 was set to 0.15 $W/cm^3$, and was applied to the bias rod 428. Thereafter, the power of a microwave power source (0.5 GHz) (not shown) was set to 0.10 $W/cm^3$, and the microwave power was fed into the i-type layer deposition chamber 418 through the bias rod 428 to cause glow discharge to take place, and the shutter 427 was opened. Thus, the MW i-type layer of the third pin structure was started to be formed on the RF n-type layer of the third pin structure, and an i-type layer with a layer thickness of 1.5 $\mu m$ was formed, whereupon the microwave glow discharge was stopped and the output from the bias power source 424 was stopped to complete the formation of the MW i-type layer 105 of the third pin structure. The valves 451, 452 and 453 were closed to stop the $SiH_4$ gas, $GeH_4$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

To form the RF i-type layer 106 of the third pin structure, the substrate heater 411 was set so as to bring the temperature of the substrate 490 to 300° C. At the time the substrate was well heated, the valves 464, 454, 450, 463 and 453 were slowly opened to flow $Si_2H_6$ gas and $H_2$ gas into the i-type layer deposition chamber 418 through the gas feed pipe 449. Here, $Si_2H_6$ gas flow rate and $H_2$ gas flow rate were controlled by means of the corresponding mass flow controllers 459 and 458 so as to be 3.5 sccm and 100 sccm, respectively. The pressure inside the i-type layer deposition chamber 418 was controlled so as to be 0.65 Torr by adjusting the opening of the conductance valve (not shown).

Next, the power of the RF power source 424 was set to 0.008 $W/cm^3$ and was applied to the bias rod 428 to cause glow discharge to take place, and the shutter 427 was opened. Thus, the RF i-type layer of the third pin structure was started to be formed on the MW i-type layer of the third pin structure, and an i-type layer with a layer thickness of 23 nm was formed, whereupon the RF glow discharge was stopped and the output from the RF power source 424 was stopped to complete the formation of the RF i-type layer 106 of the third pin structure.

The valves 464, 454, 453 and 450 were closed to stop the $Si_2H_6$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.
(Formation of RF p-type layer of third pin structure)

To form an RF p-type layer 107 of the third pin structure, comprised of SiC, first, the gate valve 408 was opened to carry the substrate 490 (with the above layers formed) into the transport chamber 404 and p-type layer deposition chamber 419 previously evacuated by means of a vacuum exhaust pump (not shown). The substrate 490 was heated in the manner the back thereof was brought into close contact with the substrate heater 412. Then, the inside of the p-type layer deposition chamber 419 was evacuated by means of the vacuum exhaust pump (not shown) to have a pressure of about $1\times10^{-5}$ Torr.

The substrate heater 412 was set so as to bring the temperature of the substrate 490 to 300° C. At the time the substrate temperature became stable, the valves 481, 471, 470, 482, 472, 483, 473, 484 and 474 were operated to feed $H_2$ gas, $SiH_4/H_2$ gas, $B_2H_6/H_2$ gas and $CH_4$ gas into the deposition chamber 419 through the gas feed pipe 469. Here, $H_2$ gas flow rate, $SiH_4/H_2$ gas flow rate, $B_2H_6/H_2$ gas flow rate and $CH_4$ gas flow rate were controlled by means of the mass flow controllers 476, 477, 478 and 479 so as to be 80 sccm, 3 sccm, 9 sccm and 0.1 sccm, respectively, and the pressure inside the deposition chamber 419 was controlled so as to be 1.8 Torr by adjusting the opening of the conductance valve (not shown).

Next, the power of the RF power source 423 was set to 0.07 $W/cm^3$, and RF power was fed to the plasma forming cup 421 to cause glow discharge to take place. Thus, the RF p-type layer of the third pin structure was started to be formed on the i-type layer, and an RF p-type layer with a layer thickness of 10 nm was formed, whereupon the RF power source was turned off to stop the glow discharge to complete the formation of the RF p-type layer 107 of the third pin structure. The valves 472, 482, 473, 483, 474, 484, 471, 481 and 470 were closed to stop the $SiH_4/H_2$ gas, $B_2H_6/H_2$ gas, $CH_4$ gas and $H_2$ gas from flowing into the p-type layer deposition chamber 419, and then the inside of the p-type layer deposition chamber 419 and the inside of the gas pipe were evacuated to have a pressure of $1\times10^{-5}$ Torr.

(Formation of RF n-type layer of second pin structure)

To form an RF n-type layer 109 of the second pin structure, comprised of $\mu$c-Si, the gate valve 408 was opened to carry the substrate 490 (with the above layers formed) into the transport chamber 403 previously evacuated by means of a vacuum exhaust pump (not shown), and the gate valve 407 was also opened to carry the substrate 490 into the transport chamber 402 and n-type layer deposition chamber 417 previously evacuated by means of a vacuum exhaust pump (not shown).

The substrate 490 was heated in the manner the back thereof was brought into close contact with the substrate heater 410. Then, the inside of the n-type layer deposition chamber 417 was evacuated by means of a vacuum exhaust pump (not shown) to have a pressure of about $1\times10^{-5}$ Torr. The substrate heater 410 was set so as to bring the temperature of the substrate 490 to 320° C. At the time the substrate temperature became stable, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 1 sccm, 150 sccm and 8 sccm, respectively, and the pressure inside the deposition chamber 417 was controlled so as to be 1.2 Torr.

Next, the power of the RF power source 422 was set to 0.07 W/cm³, and RF power was fed to the plasma forming cup 420 to cause glow discharge to take place. Thus, an RF n-type layer of the second pin structure was started to be formed on the RF p-type layer of the third pin structure, and an RF n-type layer with a layer thickness of 100 nm was formed, whereupon the RF power source was turned off to stop the glow discharge to complete the formation of the RF n-type layer 109 of the second pin structure. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1\times10^{-5}$ Torr.

(Formation of i-type layer of second pin structure)

To form an i-type layer 110 of the second pin structure, comprised of $\mu$c-Si, first the gate valve 407 was opened to carry the substrate 490 (with the above layers formed) into the transport chamber 403 and i-type layer deposition chamber 418 previously evacuated by means of a vacuum exhaust pump (not shown). The substrate 490 was heated in the manner the back thereof was brought into close contact with the substrate heater 411. Then, the inside of the 1-type layer deposition chamber 418 was evacuated by means of a vacuum exhaust pump (not shown) to have a pressure of about $1\times10^{-5}$ Torr.

The substrate heater 411 was set so as to bring the temperature of the substrate 490 to 380° C. At the time the substrate was well heated, the valves 461, 451, 450, 463 and 453 were slowly opened to flow $SiH_4$ gas and $H_2$ gas into the i-type layer deposition chamber 418 through the gas feed pipe 449. Here, $SiH_4$ gas flow rate and $H_2$ gas flow rate were controlled by means of the corresponding mass flow controllers 456 and 458 so as to be 50 sccm and 1,500 sccm, respectively. The pressure inside the i-type layer deposition chamber 418 was controlled so as to be 0.03 Torr by adjusting the opening of the conductance valve (not shown).

Next, the power of the RF power source 424 was set to 0.15 W/cm³, and was applied to the bias rod 428. Thereafter, the power of a microwave power source (0.5 GHz) (not shown) was set to 0.10 W/cm³, and the microwave power was fed into the i-type layer deposition chamber 418 through the bias rod 428 to cause glow discharge to take place. Thus, the i-type layer of the second pin structure was started to be formed on the RF n-type layer of the second pin structure, and a layer with a layer thickness of 1.5 $\mu$m was formed, whereupon the glow discharge was stopped and the output from the bias power source 424 was stopped to complete the formation of the i-type layer 110 of the second pin structure. The valves 451 and 453 were closed to stop the $SiH_4$ gas and $H_2$ gas from flowing into the i-type layer deposition chamber 418, and then the inside of the i-type layer deposition chamber 418 and the inside of the gas pipe were evacuated to have a pressure of $1\times10^{-5}$ Torr.

(Formation of RF p-type layer of second pin structure)

To form an RF p-type layer 111 of the second pin structure, comprised of SiC, the substrate 490 (with the above layers formed) was carried in the same manner as the formation of the RF p-type layer 107 of the third pin structure. The subsequent procedure for the RF p-type layer of the third pin structure was repeated except that the $H_2$ gas flow rate, $SiH_4/H_2$ gas flow rate, $B_2H_6/H_2$ gas flow rate and $CH_4$ gas flow rate were controlled by means of the mass flow controllers so as to be 80 sccm, 3 sccm, 9 sccm and 0.2 sccm, respectively, and the deposition was carries out at a substrate temperature of 260° C.

(Formation of RF n-type layer of first pin structure)

To form an RF n-type layer 112 of the first pin structure, comprised of a-Si, first the gate valve 408 was opened to carry the substrate 490 (with the above layers formed) into the transport chamber 403 previously evacuated by means of a vacuum exhaust pump (not shown), and the gate valve 407 was also opened to carry the substrate 490 into the transport chamber 402 and n-type layer deposition chamber 417 previously evacuated by means of a vacuum exhaust pump (not shown).

The subsequent procedure for the RF n-type layer of the second pin structure was repeated except that the $SiH_4$ gas flow rate, $H_2$ gas flow rate and $PH_3/H_2$ gas flow rate were controlled by means of the mass flow controllers 438, 436 and 439 so as to be 1.1 sccm, 50 sccm and 10 sccm, respectively, the pressure inside the deposition chamber 417 was controlled so as to be 1.05 Torr, and the substrate heater 410 was set so as to bring the temperature of the substrate 490 to 230° C. Thus, the RF n-type layer 112 of the first pin structure was formed.

(Formation of RF i-type layer of first pin structure)

To form an RF i-type layer 113 of the first pin structure, comprised of a-Si, the substrate 490 (with the above layers formed) was carried in the same manner as the formation of the RF i-type layer 104 of the third pin structure. The subsequent procedure for the RF i-type layer of the third pin structure was repeated except that the substrate temperature was set to 190° C., the $Si_2H_6$ gas flow rate and $H_2$ gas flow rate were controlled by means of the corresponding mass flow controllers 464 and 463 so as to be 2 sccm and 200 sccm, respectively, the pressure inside the deposition chamber 417 was controlled so as to be 0.8 Torr, and the RF power was set to 0.07 W/cm³. Thus, an RF i-type layer 113 with a layer thickness of 0.1 $\mu$m was formed.

(Formation of RF p-type layer of first pin structure)

To form an RF p-type layer 114 of the first pin structure, comprised of SiC, the substrate 490 (with the above layers formed) was carried in the same manner as the formation of the RF p-type layer 107 of the third pin structure. The subsequent procedure for the RF p-type layer of the third pin structure was repeated except that the $H_2$ gas flow rate, $SiH_4/H_2$ gas flow rate, $B_2H_6/H_2$ gas flow rate and $CH_4$ gas flow rate were controlled by means of the mass flow controllers so as to be 90 sccm, 3 sccm, 8 sccm and 0.4 sccm, respectively, and the deposition was carries out at a substrate temperature of 170° C.

Next, the gate valve 409 was opened to carry the substrate 490 (with the above layers formed) into the unload chamber 405 previously evacuated by means of a vacuum exhaust pump (not shown), and a leak valve (not shown) was opened to let gases escape from the unload chamber 405.

Next, on the RF p-type layer 114 of the first pin structure, ITO was deposited by vacuum deposition in a layer thickness of 70 nm as the transparent electrode 115.

Next, on the transparent electrode 115, a mask with a comb-shaped opening was placed, and the comb-shaped collector electrode 116 comprised of Cr(40 nm)/Ag(1,000 nm)/Cr(40 nm) was deposited by vacuum deposition.

Thus, the fabrication of the photovoltaic device of the present Example was completed. This photovoltaic device is herein called SCEx-9.

Comparative Example 5-1

In Example 9, the n-type layer of the third pin structure was formed to have a-Si, the i-type layer of the third pin structure a-SiGe, the n-type layer of the second pin structure a-Si, and the i-type layer of the second pin structure a-Si, which were all formed using RF power. Thus, a photovoltaic device SCCp-5-1 was produced. The p-type, i-type and n-type layers other than the above were formed in the same manner as in Example 9.

Gas flow rates and other conditions are shown in Table 9.

For each of the photovoltaic devices SCEx-9 and SCCp-5-1, five samples were prepared, and their characteristics were measured. As the result of measurement, the characteristics of SCCp-5-1 on the basis of those of SCEx-9 assumed as 1 were as follows: Initial photoelectric conversion efficiency: 0.85 time; short-circuit current: 0.90 time, rate of photo-deterioration: 1.12 times; rate of heat resistance deterioration: 1.17 times; cell withstand voltage: 0.93 time; and yield: 0.94 time.

Comparative Example 5-2

In Example 9, the i-type layer of the first pin structure was formed to have μc-Si using RF power. Thus, a photovoltaic device SCCp-5-2 was produced. The p-type, i-type and n-type layers other than the above were formed in the same manner as in Example 9.

For each of the photovoltaic devices SCEx-9 and SCCp-5-2, five samples were prepared, and their characteristics were measured. As the result of measurement, the characteristics of SCCp-5-2 on the basis of those of SCEx-9 assumed as 1 were as follows: Initial photoelectric conversion efficiency: 0.81 time; short-circuit current: 1.01 times, rate of photo-deterioration: 0.98 time; rate of heat resistance deterioration: 1.03 times; cell withstand voltage: 0.91 time; and yield: 0.92 time.

As is seen from Comparative Examples 5-1 and 5-2, the device in which the i-type layer of the top cell is amorphous or the i-type layers of the middle and bottom cells are microcrystalline has better characteristics than the one in which all the i-type layers are amorphous or all the i-type layers are microcrystalline.

Comparative Example 5-3

The procedure of Example 9 was repeated except that the MW i-type semiconductor layer 105 of the third pin structure, comprised of microcrystalline silicon germanium, was formed using only RF power. Thus, a photovoltaic device SCCp-5-3 was produced. As the result of measurement similarly made, the characteristics of SCCp-5-3 on the basis of those of SCEx-9 assumed as 1 were as follows: Initial photoelectric conversion efficiency: 0.93 time; rate of photo-deterioration: 1.06 times; rate of heat resistance deterioration: 1.12 times; cell withstand voltage: 0.97 time; and yield: 0.97 time.

The photovoltaic device of the present invention is seen to have superior characteristics.

Example 10

A photovoltaic device was produced in the same manner as in Example 9, but under the deposition conditions as shown in Table 10. This is called SCEx-10.

Comparative Example 6

In Example 9, the n-type layer of the third pin structure was formed to have a-Si, the i-type layer of the third pin structure a-SiGe, the n-type layer of the second pin structure a-Si, and the i-type layer of the second pin structure a-Si, which were all formed using RF power. Thus, a photovoltaic device SCCp-6 was produced. The p-type, i-type and n-type layers other than the above were formed in the same manner as in Example 9.

Gas flow rates and other conditions are shown in Table 11.

For each of the photovoltaic devices SCEx-10 and SCCp-6, four samples were prepared, and their characteristics were measured. As the result of measurement, the characteristics of SCCp-6 on the basis of those of SCEx-10 assumed as 1 were as follows: Initial photoelectric conversion efficiency: 0.86 time; short-circuit current: 0.93 time, rate of photo-deterioration: 1.12 times; rate of heat resistance deterioration: 1.14 times; cell withstand voltage: 0.95 time; and yield: 0.94 time.

The photovoltaic device of the present invention is seen to have superior characteristics.

Example 11

In Example 9, to form the i-type layer 110 of the second pin structure, comprised of μc-Si, $SiH_4$ gas flow rate and $H_2$ gas flow rate were controlled by means of the corresponding mass flow controllers 456 and 458 so as to be 50 sccm and 1,500 sccm, respectively. The pressure inside the i-type layer deposition chamber 418 was controlled so as to be 0.03 Torr by adjusting the opening of the conductance valve (not shown). Next, the power of the RF power source 424 was set to 0.15 W/cm³, and was applied to the bias rod 428. Thereafter, the power of a microwave power source (0.5 GHz) (not shown) was set to 0.1 W/cm³, and the microwave power was fed into the i-type layer deposition chamber 418 through the bias rod 428 to cause glow discharge to take place. Thus, the i-type layer of the second pin structure was started to be formed on the RF n-type layer of the second pin structure, and an i-type with a layer thickness of 1.0 μm was formed, whereupon the glow discharge was stopped and the output from the bias power source 424 was stopped to complete the formation of the i-type layer 110 of the second pin structure. In the same way, eight samples were prepared in which only the layer thickness of the i-type layer 110 of the second pin structure, comprised of μc-Si, was changed in the range of from 0.1 μm to 3.0 μm, and their initial photoelectric conversion efficiency, short-circuit current, open current voltage, fill factor, rate of photo-deterioration, and yield were measured.

Results obtained are shown in Table 12. In respect of the initial photoelectric conversion efficiency, devices satisfactory for practical use were obtained when the i-type layer was formed in a layer thickness of from 0.5 μm to 2.8 μm. The fill factor showed a tendency to decrease with an increase in layer thickness of the i-type layer 110 of the second pin structure, and the rate of photo-deterioration showed a tendency to increase with an increase in layer thickness of the i-type layer 110 of the second pin structure. With regard to the short-circuit current, open current voltage and yield, good results were shown with an increase in layer thickness of the i-type layer 110 of the second pin structure.

Photovoltaic devices having superior characteristics were obtained when the i-type layer 110 of the second pin structure, comprised of μc-Si, was formed in a layer thickness of from 0.5 μm to 2.5 μm.

Example 12

In Example 9, to form the i-type layer 105 of the third pin structure, comprised of μc-SiGe, $SiH_4$ gas flow rate, $GeH_4$ gas flow rate and $H_2$ gas flow rate were controlled by means of the corresponding mass flow controllers 456, 457 and 458 so as to be 40 sccm, 40 sccm and 1,500 sccm, respectively. The pressure inside the i-type layer deposition chamber 418 was controlled so as to be 0.03 Torr by adjusting the opening of the conductance valve (not shown). Next, the power of the RF power source 424 was set to 0.15 W/cm³, and was applied to the bias rod 428. Thereafter, the power of a microwave power source (0.5 GHz) (not shown) was set to 0.1 W/cm³, and the microwave power was fed into the i-type layer deposition chamber 418 through the bias rod 428 to cause glow discharge to take place. Thus, the i-type layer of the third pin structure was started to be formed on the RF n-type layer of the third pin structure, and an i-type layer with a layer thickness of 1.0 μm was formed, whereupon the glow discharge was stopped and the output from the bias power source 424 was stopped to complete the formation of the i-type layer 105 of the third pin structure. In the same way, eight samples were prepared in which only the layer thickness of the i-type layer 105 of the third pin structure, comprised of μc-SiGe, was changed in the range of from 0.1 μm to 2.5 μm, and their initial photoelectric conversion efficiency, short-circuit current, open current voltage, fill factor, rate of photo-deterioration, and yield were measured.

Results obtained are shown in Table 13. In respect of the initial photoelectric conversion efficiency, devices satisfactory for practical use were obtained when the i-type layer was formed in a layer thickness of from 0.2 μm to 2.3 μm. The fill factor showed a tendency to decrease with an increase in layer thickness of the i-type layer 105 of the third pin structure, and the rate of photo-deterioration showed a tendency to increase with an increase in layer thickness of the i-type layer 105 of the third pin structure. With regard to the short-circuit current, open current voltage and yield, good results were shown with an increase in layer thickness of the i-type layer 105 of the third pin structure.

Example 13

In Example 9, the n-type layer 109 of the second pin structure was formed in the same way. To form the i-type layer 110 of the second pin structure, comprised of μc-Si, $SiH_4$ gas flow rate and $H_2$ gas flow rate were controlled by means of the corresponding mass flow controllers 456 and 458 so as to be 50 sccm and 1,500 sccm, respectively, and $B_2H_6/H_2$ gas flow rate was controlled by means of the mass flow controller 460 so that boron content in microcrystalline silicon of the i-type layer 110 of the second pin structure ranged from 0 ppm to 10.0 ppm, thus photovoltaic devices were produced. The other p-type, i-type and n-type layers were formed in the same manner as in Example 9. The boron content in the i-type layer 110 of the second pin structure was measured using IMF-4F (Trade name), manufactured by CAMECA Co.

Good-quality i-type layers having superior initial photoelectric conversion efficiency, stabilized photoelectric conversion efficiency, rate of photo-deterioration and yield after heat deterioration were obtained when the i-type layer 110 of the second pin structure had a boron content in silicon of 8.0 ppm or less. The results are shown in Table 14.

Example 14

In Example 9, the n-type layer 103 of the third pin structure was formed in the same way. To form the i-type layer 105 of the third pin structure, comprised of μc-SiGe, $SiH_4$ gas flow rate, $GeH_4$ gas flow rate and $H_2$ gas flow rate were controlled by means of the corresponding mass flow controllers 456, 457 and 458 so as to be 40 sccm, 40 sccm and 1,500 sccm, respectively, and $B_2H_6/H_2$ gas flow rate was controlled by means of the mass flow controller 460 so that boron content in microcrystalline silicon of the i-type layer 105 of the third pin structure ranged from 0 ppm to 10.0 ppm, thus photovoltaic devices were produced. The other p-type, i-type and n-type layers were formed in the same manner as in Example 9. The boron content in the i-type layer 105 of the third pin structure was measured using IMF-4F (Trade name), manufactured by CAMECA Co.

Good-quality i-type layers having superior initial photoelectric conversion efficiency, stabilized photoelectric conversion efficiency, rate of photo-deterioration and yield after heat deterioration were obtained when the i-type layer 105 of the third pin structure had a boron content in silicon germanium of 8.0 ppm or less. The results are shown in Table 15.

Example 15

In Example 9, a photovoltaic device SCEx-15 was produced in which the n-type layer of the second pin structure was changed to have a laminated structure comprised of an amorphous semiconductor layer and a microcrystalline semiconductor layer, constituted as shown in FIG. 2. The buffer layer 204, however, was nor provided. In FIG. 2, reference numeral 208 denotes an n-type amorphous semiconductor (a-Si) layer and 209 an n-type microcrystalline semiconductor (μc-Si) layer.

To form the RF n-type layer 208 of the second pin structure, comprised of a-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 100 sccm and 5 sccm, respectively, and the pressure inside the deposition chamber 417 was controlled so as to be 1.0 Torr.

Next, the power of the RF power source 422 was set to 0.03 W/cm³, and RF power was fed to the plasma forming cup 420 to cause glow discharge to take place. Thus, an RF n-type layer of the second pin structure was started to be formed on the p-type layer 207 of the third pin structure, and an RF n-type layer with a layer thickness of 15 nm was formed, whereupon the RF power source was turned off to stop the glow discharge to complete the formation of the RF n-type layer 208 of the second pin structure. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

The other deposited layers were formed in the same manner as in Example 9.

Comparative Example 7

A photovoltaic device SCCp-7 was produced under the same conditions as in Example 15 except that the RF n-type layer of the second pin structure was formed to have a-Si, and the i-type layer of the second pin structure a-Si.

For each of the photovoltaic devices SCEx-15 and SCCp-7, six samples were prepared, and their characteristics were measured. As the result of measurement, the characteristics of SCCp-7 on the basis of those of SCEx-15 assumed as 1 were as follows: Initial photoelectric conversion efficiency: 0.87 time; short-circuit current: 0.91 time, rate of photo-deterioration: 1.12 times; rate of heat resistance deterioration: 1.13 times; cell withstand voltage: 0.94 time; and yield: 0.94 time.

The photovoltaic device of the present invention is seen to have superior characteristics.

Example 16

A photovoltaic device SCEx-16 was produced in which the n-type layer of the third pin structure was changed to have a laminated structure comprised of an amorphous semiconductor layer and a microcrystalline semiconductor layer. The constitution is shown in FIG. 3. In FIG. 3, reference numeral 317 denotes an n-type amorphous semiconductor (a-Si) layer and 303 an n-type microcrystalline semiconductor ($\mu$c-Si) layer. As the buffer layer of the i-type layer 305 of the third pin structure, a layer 306 was provided.

To form the RF n-type layer 317 of the third pin structure, comprised of a-Si, the valves 443, 433, 444 and 434 were operated to feed $SiH_4$ gas and $PH_3/H_2$ gas into the deposition chamber 417 through the gas feed pipe 429. Here, $SiH_4$ gas flow rate, $H_2$ gas flow rate and $PH_3/H_2$ gas flow rate were controlled by means of the mass flow controllers 438, 436 and 439 so as to be 2 sccm, 100 sccm and 5 sccm, respectively, and the pressure inside the deposition chamber 417 was controlled so as to be 1.0 Torr.

Next, the power of the RF power source 422 was set to 0.03 W/cm³, and RF power was fed to the plasma forming cup 420 to cause glow discharge to take place. Thus, an RF n-type layer of the third pin structure was started to be formed on the substrate, and an RF n-type layer with a layer thickness of 20 nm was formed, whereupon the RF power source was turned off to stop the glow discharge to complete the formation of the RF n-type layer 317 of the third pin structure. The $SiH_4$ gas, $PH_3/H_2$ gas and $H_2$ gas were stopped from flowing into the deposition chamber 417, and then the inside of the deposition chamber and the inside of the gas pipe were evacuated to have a pressure of $1 \times 10^{-5}$ Torr.

The other deposited layers shown in FIG. 3 were formed in the same manner as in Example 9.

Comparative Example 8

A photovoltaic device SCCp-8 was produced under the same conditions as in Example 16 except that the RF n-type layer of the third pin structure was formed to have a-Si, and the i-type layer of the second pin structure a-SiGe.

For each of the photovoltaic devices SCEx-16 and SCCp-8, six samples were prepared, and their characteristics were measured. As the result of measurement, the characteristics of SCCp-8 on the basis of those of SCEx-16 assumed as 1 were as follows: Initial photoelectric conversion efficiency: 0.88 time; short-circuit current: 0.89 time, rate of photo-deterioration: 1.13 times; rate of heat resistance deterioration: 1.12 times; cell withstand voltage: 0.95 time; and yield: 0.95 time.

The photovoltaic device of the present invention is seen to have superior characteristics.

Example 17

In Example 9, to form the MW i-type layer 105 of the third pin structure, $SiH_4$ gas flow rate and $H_2$ gas flow rate were controlled by means of the corresponding mass flow controllers 456 and 458 so as to be 50 sccm and 1,500 sccm, respectively, and $GeH_4$ gas flow rate was changed so as to range from 20 atom % to 60 atom %. Thus, a photovoltaic device was produced. The germanium content in the MW i-type layer 105 of the third pin structure was measured using IMF-4F (Trade name), manufactured by CAMECA Co. Results obtained are shown in Tables 16 and 17.

When the germanium content in microcrystalline silicon germanium of the i-type semiconductor layer is in a content of 40 atom % or more, without regard to whether the $GeH_4$ gas flow rate was constant or gradient, the i-type layer of the third pin structure had a band gap suited for absorbing long-wavelength light in the photovoltaic device of the present invention and sufficient electric currents were obtained in the third pin structure, thus improvements in efficiency were seen as a whole.

Example 18

In the formation of the MW i-type layer 105, the microcrystalline silicon germanium layer, of the third pin structure, the flow rates of the film-forming gases $SiH_4$ gas, $GeH_4$ gas and $H_2$ gas were changed to produce photovoltaic devices having different light absorption coefficients. The layer thickness was uniformed in 0.3 $\mu$m in making measurement. The light absorption coefficient was measured using a spectrophotometer.

Photovoltaic devices having a low rate of photo-deterioration and having superior fill factor and stabilized conversion efficiency were obtained in respect of those having a light absorption coefficient of 10,000 cm$^{-1}$ or above. In i-type semiconductor layers having a high light absorption coefficient, it was possible to form films having a much lower rate of photo-deterioration and able to take a low open current voltage, when formed in a smaller thickness.

Example 19

The triple type photovoltaic device as shown in FIG. 1 was produced using the deposition apparatus employing a roll-to-roll system as shown in FIG. 5. However, the i-type layer 105 of the third pin structure was formed of microcrystalline silicon germanium and the buffer layer 104 was not provided.

As the substrate, a sheet-like substrate of 300 m long, 30 cm wide and 0.2 mm thick, having light-reflecting layers (a metal layer and a transparent conductive layer) was used. Then, under conditions shown in Table 8 for the other deposited layers, the triple type photovoltaic device was produced in the following way.

The sheet-like substrate having the light-reflecting layers was set in the load chamber 5010 for feeding the substrate. This sheet-like substrate was passed through all the deposition chambers and all the gas gates and connected to the sheet wind-up jig in the unload chamber 5150. The respective deposition chambers were evacuated to $10^{-3}$ Torr or below by means of exhaust systems (not shown). The desired materials gases were fed into the respective deposition chambers from the deposited film forming mixing systems 5026, 5036, 5046, 5056, 5066, 5076, 5096, 5116, 5126, 5136 and 5146. To the gas gates 5201, 5202, 5203, 5204, 5205, 5206, 5207, 5210, 5211, 5212, 5213 and 5214, gas was fed from the respective gate gas feeding system.

The substrate was heated by means of the substrate heater in each deposition system, and the degree of vacuum was controlled by adjusting the opening of the exhaust valve of each exhaust system. After the substrate temperature and degree of vacuum became stable, the substrate was started to be transported, and RF power or MW (frequency: 0.5 GHz, 2.45 GHz) power for generating plasma was supplied to each deposition chamber. In this way, the triple type photovoltaic device having the three pin structures superposed as shown in FIG. 1, was formed on the sheet-like substrate over a length of 100 m. In the formation of the i-type semiconductor layer of the second pin structure, microwave power (0.5 GHz) was applied.

Next, on the RF p-type layer 114, ITO was deposited by vacuum deposition in a layer thickness of 70 nm as the transparent electrode 115.

Next, on the transparent electrode 115, a mask with a comb-shaped opening was placed, and the comb-shaped collector electrode 116 comprised of Cr(40 nm)/Ag(1,000 nm)/Cr(40 nm) was deposited by vacuum deposition.

Thus, the fabrication of a photovoltaic device was completed. This photovoltaic device is called SCEx-19.

Comparative Example 9

A photovoltaic device SCCp-9 was produced under the same conditions as in Example 19 except that the RF n-type layer of the third pin structure was formed to have $\mu$c-Si, and the i-type layer of the second pin structure $\mu$c-SiGe.

For each of the photovoltaic devices SCEx-19 and SCCp-9, eight samples were prepared, and their characteristics were measured. As the result of measurement, the characteristics of SCCp-9 on the basis of those of SCEx-19 assumed as 1 were as follows: Initial photoelectric conversion efficiency: 0.88 time; short-circuit current: 0.93 time, rate of photo-deterioration: 1.07 times; rate of heat resistance deterioration: 1.08 times; cell withstand voltage: 0.94 time; and yield: 0.95 time.

The photovoltaic device of the present invention is seen to have superior characteristics.

Example 20

In Example 9, the i-type semiconductor layers of the third pin structure were formed using a microwave power (2.45 GHz) in place of the microwave power (0.5 GHz), and the same triple type photovoltaic device as that of Example 9 was produced using the deposition apparatus employing a roll-to-roll system as shown in FIG. 5. This photovoltaic device is called SCEx-20.

As the result of measurement, the characteristics of SCCp-9 on the basis of those of SCEx-20 assumed as 1 were as follows: Initial photoelectric conversion efficiency: 0.89 time; short-circuit current: 0.91 time, rate of photo-deterioration: 1.08 times; rate of heat resistance deterioration: 1.10 times; cell withstand voltage: 0.94 time; and yield: 0.96 time.

The photovoltaic device of the present invention is seen to have superior characteristics.

TABLE 1

| Layer thickness of i-type layer of 2nd pin: ($\mu$m) | 0.1 | 0.2 | 0.3 | 1.0 | 1.5 | 2.2 | 2.4 | 3.0 |
|---|---|---|---|---|---|---|---|---|
| Initial photoelectric conversion efficiency: | C | B | B | A | A | A | B | C |
| Short-circuit current: | C | C | B | A | A | A | B | C |
| Open current voltage: | B | B | A | A | A | A | A | B |
| Fill factor: | A | A | A | A | A | B | B | B |
| Rate of photo-deterioration: | A | A | A | A | A | A | A | B |
| Yield: | C | B | A | A | A | A | A | A |

A: Optimum for practical use
B: Satisfactory for practical use
C: Unsatisfactory for practical use

TABLE 2

| Boron (B) content in microcrystalline Si (ppm): | 0 ppm | 1 ppm | 3 ppm | 8 ppm | 10 ppm |
|---|---|---|---|---|---|
| Initial photoelectric conversion efficiency: | A | A | A | B | C |
| Stabilized photoelectric conversion efficiency: | A | A | A | A | B |
| Rate of photo-deterioration: | A | A | A | A | B |
| Yield after heat deterioration: | A | A | A | B | C |

A: Optimum for practical use
B: Satisfactory for practical use
C: Unsatisfactory for practical use

TABLE 3

| Germanium (Ge) content in amorphous SiGe: (atom %) | 20% | 30% | 45% | 50% | 55% | 60% | 75% |
|---|---|---|---|---|---|---|---|
| Initial photoelectric conversion efficiency: | C | B | A | A | A | A | A |
| Stabilized photoelectric conversion efficiency: | C | C | A | A | A | A | A |
| Open current voltage: | A | A | A | A | A | A | A |
| Short-circuit current: | C | B | A | A | A | A | A |

A: Optimum for practical use
B: Satisfactory for practical use
C: Unsatisfactory for practical use

TABLE 4

| Average germanium (Ge) content in amorphous SiGe: (atom %) | 30% (20–40%) | 50% (40–60%) | 70% (60–80%) |
|---|---|---|---|
| Initial photoelectric conversion efficiency: | C | A | A |
| Stabilized photoelectric conversion efficiency: | C | A | A |
| Open current voltage: | A | A | A |
| Short-circuit current: | C | A | A |

TABLE 4-continued

| Average germanium (Ge) content in amorphous SiGe: (atom %) | 30% (20–40%) | 50% (40–60%) | 70% (60–80%) |
|---|---|---|---|

A: Optimum for practical use
B: Satisfactory for practical use
C: Unsatisfactory for practical use

TABLE 5

(Comparative Example 1)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^3$) | RF power (W/cm$^3$) | Substrate temp. (°C.) | Layer thickness (nm) |
|---|---|---|---|---|---|---|---|---|---|---|---|---|---|
| RF n-type layer: (103) | 2.2 | — | — | — | 80 | 10 | — | — | 1.3 | — | 0.05 | 380 | 10 |
| RF i-type layer: (104) | — | 3.5 | — | — | 100 | — | — | — | 0.65 | — | 0.008 | 300 | 10 |
| MW i-type layer: (105) | 48 | — | — | 51 | 170 | — | — | — | 0.01 | 0.1 | 0.32 | 380 | 170 |
| RF i-type layer: (106) | — | 3.5 | — | — | 100 | — | — | — | 0.65 | — | 0.008 | 300 | 23 |
| RF p-type layer: (107) | — | 0.1 | — | — | 80 | — | 9 | 3 | 1.8 | — | 0.07 | 300 | 10 |
| RF n-type layer: (109) | 2.0 | — | — | — | 70 | 8 | — | — | 1.2 | — | 0.07 | 320 | 10 |
| MW i-type layer: (110) | 50 | — | — | — | 250 | — | — | — | 0.02 | 0.1 | 0.205 | 320 | 150 |
| RF p-type layer: (111) | — | — | 0.2 | — | 80 | — | 9 | 3 | 1.7 | — | 0.07 | 260 | 10 |
| RF n-type layer: (112) | 1.1 | — | — | — | 50 | 10 | — | — | 1.05 | — | 0.04 | 230 | 10 |
| RF i-type layer: (113) | — | 2.0 | — | — | 200 | — | — | — | 0.8 | — | 0.007 | 190 | 90 |
| RF p-type layer: (114) | — | — | 0.4 | — | 90 | — | 8 | 3 | 1.6 | — | 0.07 | 170 | 10 |

TABLE 6

(Example 2)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^3$) | RF power (W/cm$^3$) | Substrate temp. (°C.) | Layer thickness (nm) |
|---|---|---|---|---|---|---|---|---|---|---|---|---|---|
| RF n-type layer: (103) | 2.2 | — | — | — | 75 | 10 | — | — | 1.3 | — | 0.05 | 380 | 10 |
| RF i-type layer: (104) | — | 4.0 | — | — | 100 | — | — | — | 0.65 | — | 0.008 | 290 | 10 |
| MW i-type layer: (105) | 48 | — | — | 51 | 170 | — | — | — | 0.01 | 0.10 | 0.32 | 380 | 170 |
| RF i-type layer: (106) | — | 4.0 | — | — | 100 | — | — | — | 0.65 | — | 0.008 | 290 | 23 |
| RF p-type layer: (107) | — | — | 0.1 | — | 80 | — | 9 | 4 | 1.8 | — | 0.08 | 300 | 10 |
| RF n-type layer: (109) | 1.0 | — | — | — | 150 | 8 | — | — | 1.2 | — | 0.08 | 320 | 100 |
| MW i-type layer: (110) | 45 | — | — | — | 800 | — | — | — | 0.02 | 0.15 | 0.12 | 370 | 1,500 |

TABLE 6-continued (Example 2)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^3$) | RF power (W/cm$^3$) | Substrate temp. (° C.) | Layer thickness (nm) |
|---|---|---|---|---|---|---|---|---|---|---|---|---|---|
| RF p-type layer: (111) | — | — | 0.2 | — | 80 | — | 9 | 4 | 1.7 | — | 0.08 | 260 | 10 |
| RF n-type layer: (112) | 1.1 | — | — | — | 50 | 10 | — | — | 1.05 | — | 0.04 | 220 | 10 |
| RF i-type layer: (113) | — | 2.0 | — | — | 200 | — | — | — | 0.8 | — | 0.007 | 190 | 90 |
| RF p-type layer: (114) | — | — | 0.4 | — | 90 | — | 8 | 4 | 1.6 | — | 0.08 | 160 | 10 |

TABLE 7

(Comparative Example 2)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^3$) | RF power (W/cm$^3$) | Substrate temp. (° C.) | Layer thickness (nm) |
|---|---|---|---|---|---|---|---|---|---|---|---|---|---|
| RF n-type layer: (103) | 2.2 | — | — | — | 80 | 10 | — | — | 1.3 | — | 0.05 | 370 | 10 |
| RF i-type layer: (104) | — | 3.5 | — | — | 90 | — | — | — | 0.65 | — | 0.008 | 300 | 10 |
| MW i-type layer: (105) | 48 | — | — | 53 | 170 | — | — | — | 0.02 | 0.1 | 0.32 | 370 | 170 |
| RF i-type layer: (106) | — | 3.5 | — | — | 90 | — | — | — | 0.67 | — | 0.008 | 300 | 20 |
| RF p-type layer: (107) | — | — | 0.1 | — | 80 | — | 8 | 3 | 1.8 | — | 0.07 | 300 | 10 |
| RF n-type layer: (109) | 2.0 | — | — | — | 70 | 8 | — | — | 1.2 | — | 0.07 | 320 | 10 |
| MW i-type layer: (110) | 50 | — | — | 250 | — | — | — | — | 0.02 | 0.1 | 0.205 | 320 | 150 |
| RF p-type layer: (111) | — | — | 0.2 | — | 80 | — | 8 | 3 | 1.8 | — | 0.07 | 250 | 10 |
| RF n-type layer: (112) | 1.3 | — | — | — | 50 | 10 | — | — | 1.05 | — | 0.04 | 230 | 10 |
| RF i-type layer: (113) | — | 2.0 | — | — | 100 | — | — | — | 0.8 | — | 0.007 | 180 | 90 |
| RF p-type layer: (114) | — | — | 0.4 | — | 90 | — | 8 | 3 | 1.6 | — | 0.07 | 170 | 10 |

TABLE 8

(Example 7)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^3$) | RF power (W/cm$^3$) | Substrate temp. (° C.) | Layer thickness (nm) |
|---|---|---|---|---|---|---|---|---|---|---|---|---|---|
| RF n-type layer: (103) | 2.2 | — | — | — | 80 | 10 | — | — | 1.3 | — | 0.05 | 380 | 10 |

TABLE 8-continued (Example 7)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^3$) | RF power (W/cm$^3$) | Substrate temp. (°C.) | Layer thickness (nm) |
|---|---|---|---|---|---|---|---|---|---|---|---|---|---|
| RF i-type layer: (104) | — | 3.5 | — | — | 100 | — | — | — | 0.65 | — | 0.008 | 300 | 10 |
| MW i-type layer: (105) | 48 | — | — | 51 | 170 | — | — | — | 0.010 | 0.10 | 0.32 | 380 | 170 |
| RF i-type layer: (106) | — | 3.5 | — | — | 100 | — | — | — | 0.65 | — | 0.008 | 300 | 23 |
| RF p-type layer: (107) | — | — | 0.1 | — | 80 | — | 9 | 3 | 1.8 | — | 0.07 | 300 | 10 |
| RF n-type layer: (109) | 1.0 | — | — | — | 150 | 8 | — | — | 1.2 | — | 0.07 | 320 | 100 |
| MW i-type layer: (110) | 50 | — | — | — | 1,500 | — | — | — | 0.03 | 0.1 | 0.15 | 380 | 1,500 |
| RF p-type layer: (111) | — | — | 0.2 | — | 80 | — | 9 | 3 | 1.7 | — | 0.07 | 260 | 10 |
| RF n-type layer: (112) | 1.1 | — | — | — | 50 | 10 | — | — | 1.05 | — | 0.04 | 230 | 10 |
| RF i-type layer: (113) | — | 2.0 | — | — | 200 | — | — | — | 0.8 | — | 0.007 | 190 | 90 |
| RF p-type layer: (114) | — | — | 0.4 | — | 90 | — | 8 | 3 | 1.6 | — | 0.07 | 170 | 10 |

TABLE 9

(Comparative Example 5-1)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/ H$_2$ Flow rate (sccm) | B$_2$H$_6$/ H$_2$ Flow rate (sccm) | SiH$_4$/ H$_2$ Flow rate (sccm) | Pressure (Torr) | MW power (W/cm$^3$) | RF power (W/cm$^3$) | Substrate temp. (°C.) | Layer thickness (nm) |
|---|---|---|---|---|---|---|---|---|---|---|---|---|---|
| RF n-type layer: (103) | 1.2 | — | — | — | 50 | 5 | — | — | 1.2 | — | 0.06 | 370 | 10 |
| RF i-type layer: (105) | 5 | — | — | 5 | 140 | — | — | — | 1.5 | — | 0.08 | 370 | 120 |
| RF i-type layer: (106) | — | 3.5 | — | — | 100 | — | — | — | 0.65 | — | 0.008 | 310 | 23 |
| RF p-type layer: (107) | — | — | 0.2 | — | 80 | — | 8 | 4 | 1.8 | — | 0.06 | 310 | 10 |
| RF n-type layer: (109) | 1.0 | — | — | — | 130 | 8 | — | — | 1.2 | — | 0.06 | 320 | 100 |
| RF i-type layer: (110) | 5 | — | — | — | 120 | — | — | — | 1.3 | — | 0.08 | 380 | 150 |
| RF p-type layer: (111) | — | — | 0.3 | — | 70 | — | 8 | 4 | 1.7 | — | 0.06 | 260 | 10 |
| RF n-type layer: (112) | 1 | — | — | — | 55 | 6 | — | — | 1.3 | — | 0.06 | 230 | 10 |
| RF i-type layer: (113) | — | 2.0 | — | — | 220 | — | — | — | 0.8 | — | 0.006 | 190 | 100 |
| RF p-type layer: (114) | — | — | 0.3 | — | 150 | — | 8 | 4 | 1.5 | — | 0.06 | 160 | 10 |

TABLE 10

(Example 10)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^3$) | RF power (W/cm$^3$) | Substrate temp. (° C.) | Layer thickness (nm) |
|---|---|---|---|---|---|---|---|---|---|---|---|---|---|
| RF n-type layer: (103) | 1.2 | — | — | — | 150 | 8 | — | — | 1.3 | — | 0.07 | 380 | 10 |
| MW i-type layer: (105) | 30 | — | — | 30 | 800 | — | — | — | 0.03 | 0.1 | 0.15 | 420 | 1,500 |
| RF i-type layer: (106) | — | 3.5 | — | — | 100 | — | — | — | 0.65 | — | 0.008 | 300 | 23 |
| RF p-type layer: (107) | — | — | 0.1 | — | 80 | — | 9 | 3 | 1.8 | — | 0.07 | 300 | 10 |
| RF n-type layer: (109) | 1.0 | — | — | — | 150 | 8 | — | — | 1.2 | — | 0.07 | 320 | 100 |
| MW i-type layer: (110) | 25 | — | — | — | 500 | — | — | — | 0.02 | 0.1 | 0.15 | 380 | 1,200 |
| RF p-type layer: (111) | — | — | 0.2 | — | 80 | — | 9 | 3 | 1.7 | — | 0.07 | 260 | 10 |
| RF n-type layer: (112) | 1.1 | — | — | — | 50 | 10 | — | — | 1.05 | — | 0.04 | 230 | 10 |
| RF i-type layer: (113) | — | 2.0 | — | — | 200 | — | — | — | 0.8 | — | 0.007 | 190 | 100 |
| RF p-type layer: (114) | — | — | 0.4 | — | 90 | — | 8 | 3 | 1.6 | — | 0.07 | 170 | 10 |

TABLE 11

(Comparative Example 6)

| | SiH$_4$ Flow rate (sccm) | Si$_2$H$_6$ Flow rate (sccm) | CH$_4$ Flow rate (sccm) | GeH$_4$ Flow rate (sccm) | H$_2$ Flow rate (sccm) | PH$_3$/H$_2$ Flow rate (sccm) | B$_2$H$_6$/H$_2$ Flow rate (sccm) | SiH$_4$/H$_2$ Flow rate (sccm) | Pressure (Torr) | MW power (W/cm$^3$) | RF power (W/cm$^3$) | Substrate temp. (° C.) | Layer thickness (nm) |
|---|---|---|---|---|---|---|---|---|---|---|---|---|---|
| RF n-type layer: (103) | 1.2 | — | — | — | 45 | 5 | — | — | 1.2 | — | 0.07 | 380 | 10 |
| RF i-type layer: (105) | 4 | — | — | 4 | 150 | — | — | — | 1.5 | — | 0.08 | 380 | 120 |
| RF i-type layer: (106) | — | 3.5 | — | — | 100 | — | — | — | 0.65 | — | 0.01 | 300 | 23 |
| RF p-type layer: (107) | — | — | 0.1 | — | 80 | — | 9 | 3 | 1.8 | — | 0.07 | 300 | 10 |
| RF n-type layer: (109) | 1.0 | — | — | — | 150 | 8 | — | — | 1.2 | — | 0.07 | 320 | 100 |
| RF i-type layer: (110) | 5 | — | — | — | 120 | — | — | — | 1.3 | — | 0.08 | 380 | 150 |
| RF p-type layer: (111) | — | — | 0.2 | — | 90 | — | 9 | 3 | 1.5 | — | 0.07 | 260 | 10 |
| RF n-type layer: (112) | 1 | — | — | — | 50 | 6 | — | — | 1.3 | — | 0.06 | 230 | 10 |
| RF i-type layer: (113) | — | 2.0 | — | — | 180 | — | — | — | 0.8 | — | 0.01 | 190 | 100 |
| RF p-type layer: (114) | — | — | 0.2 | — | 100 | — | 8 | 3 | 1.5 | — | 0.07 | 160 | 10 |

TABLE 12

| Layer thickness of i-type layer of 2nd pin: (μm) | 0.1 | 0.5 | 1.0 | 1.5 | 2.0 | 2.5 | 2.8 | 3.0 |
|---|---|---|---|---|---|---|---|---|
| Initial photoelectric conversion efficiency: | C | B | A | A | A | A | B | C |
| Short-circuit current: | C | B | A | A | B | B | B | C |
| Open current voltage: | B | A | A | A | A | A | A | B |
| Fill factor: | A | A | A | A | B | B | B | |
| Rate of photo-deterioration: | A | A | A | A | A | B | B | |
| Yield: | B | A | A | A | A | A | A | |

TABLE 12-continued

| Layer thickness of i-type layer of 2nd pin: (μm) | 0.1 | 0.5 | 1.0 | 1.5 | 2.0 | 2.5 | 2.8 | 3.0 |
|---|---|---|---|---|---|---|---|---|

A: Optimum for practical use
B: Satisfactory for practical use
C: Unsatisfactory for practical use

TABLE 13

| Layer thickness of i-type layer of 3rd pin: (μm) | 0.1 | 0.2 | 0.5 | 1.0 | 1.5 | 2.0 | 2.3 | 2.5 |
|---|---|---|---|---|---|---|---|---|
| Initial photoelectric conversion efficiency: | C | B | A | A | A | A | B | C |
| Short-circuit current: | C | B | A | A | A | A | B | C |
| Open current voltage: | B | A | A | A | A | A | B | B |
| Fill factor: | A | A | A | A | A | B | B | B |
| Rate of photo-deterioration: | A | A | A | A | A | B | B | B |
| Yield: | B | A | A | A | A | A | A |  |

A: Optimum for practical use
B: Satisfactory for practical use
C: Unsatisfactory for practical use

TABLE 14

| Boron (B) content in microcrystalline Si (ppm): | 0 ppm | 1 ppm | 3 ppm | 8 ppm | 10 ppm |
|---|---|---|---|---|---|
| Initial photoelectric conversion efficiency: | A | A | A | B | C |
| Stabilized photoelectric conversion efficiency: | A | A | A | A | B |
| Rate of photo-deterioration: | A | A | A | B | C |
| Yield after heat deterioration: | A | A | A | B | C |

A: Optimum for practical use
B: Satisfactory for practical use
C: Unsatisfactory for practical use

TABLE 15

| Boron (B) content in microcrystalline SiGe (ppm): | 0 ppm | 1 ppm | 3 ppm | 8 ppm | 10 ppm |
|---|---|---|---|---|---|
| Initial photoelectric conversion efficiency: | A | A | A | B | C |
| Stabilized photoelectric conversion efficiency: | A | A | A | A | B |
| Rate of photo-deterioration: | A | A | A | A | B |
| Yield after heat deterioration: | A | A | A | B | C |

A: Optimum for practical use
B: Satisfactory for practical use
C: Unsatisfactory for practical use

TABLE 16

| Germanium (Ge) content in microcrystalline SiGe: (atom %) | 20% | 30% | 40% | 50% | 60% | 75% |
|---|---|---|---|---|---|---|
| Initial photoelectric conversion efficiency: | C | B | A | A | A | A |
| Stabilized photoelectric conversion efficiency: | C | C | A | A | A | A |
| Open current voltage: | A | A | A | A | A | A |
| Short-circuit current: | C | B | A | A | A | A |

A: Optimum for practical use
B: Satisfactory for practical use
C: Unsatisfactory for practical use

TABLE 17

| Average germanium (Ge) content in microcrystalline SiGe: (atom %) | 25% (20–30%) | 45% (40–50%) | 65% (60–70%) |
|---|---|---|---|
| Initial photoelectric conversion efficiency: | C | A | A |
| Stabilized photoelectric conversion efficiency: | C | A | A |
| Open current voltage: | A | A | A |
| Short-circuit current: | C | A | A |

A: Optimum for practical use
B: Satisfactory for practical use
C: Unsatisfactory for practical use

What is claimed is:

1. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having a p-type semiconductor layer and an i-type semiconductor layer, the i-type semiconductor layer of the first pin structure comprises amorphous silicon, the i-type semiconductor layers of the second pin structure comprises microcrystalline silicon and the i-type semiconductor layer of the third pin structure comprises amorphous silicon germanium and the p-type semiconductor layer and the n-type semiconductor layer in each said pin structure comprises a compound selected from the group consisting of a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SIC:HX, μc-SiGe:H, μc-SiO:H, μC-SiGeC:H, μc-SiN:H, μc-SiON:HX, μc-SiOCN:HX, poly-Si:H, poly-SiHX, poly-SiC:H, poly-SiC:HX, poly-SiGe:H, poly-Si, poly-SiC and poly-SiGe.

2. The photovoltaic device according to claim 1, wherein the i-type semiconductor layer of the second pin structure has a layer thickness of from 300 nm to 2,200 nm.

3. The photovoltaic device according to claim 1, wherein the i-type semiconductor layer of the second pin structure comprises boron, the boron being contained in an amount of not more than 8 ppm.

4. The photovoltaic device according to claim 1, wherein the amorphous silicon germanium in the i-type semiconductor layer of the third pin structure has an average germanium content of not less than 45 atom %.

5. The photovoltaic device according to claim 1, wherein the i-type semiconductor layer of the third pin structure has a layer thickness of from 60 nm to 250 nm.

6. The photovoltaic device according to claim 1, wherein the amorphous silicon germanium in the i-type semiconductor layer of the third pin structure is formed by microwave plasma-assisted chemical vapor deposition.

7. The photovoltaic device according to claim 1, wherein the i-type semiconductor layer of the first pin structure has a layer thickness of from 50 nm to 250 nm.

8. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having an i-type semiconductor layer; and the i-type semiconductor layer of the first pin structure comprises amorphous silicon, the i-type semiconductor layer of the second pin structure comprises microcrystalline silicon, the n-type semiconductor layer of the second pin structure has a laminated structure comprised of a layer comprising microcrystalline silicon and a layer comprising amorphous silicon and the i-type semiconductor layer of the third pin structure comprises amorphous silicon germanium.

9. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having an i-type semiconductor layer; and the i-type semiconductor layer of the first pin structure comprises amorphous silicon, the i-type semiconductor layer of the second pin structure comprises microcrystalline silicon and the i-type semiconductor layer of the third pin structure comprises amorphous silicon germanium and has spaced, on at least one interface thereof, a buffer layer containing no germanium.

10. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having a p-type semiconductor layer and an i-type semiconductor layer; the i-type semiconductor layer of the first pin structure comprises amorphous silicon, the i-type semiconductor layer of the second pin structure comprises microcrystalline silicon and the i-type semiconductor layer of the third pin structure comprises microcrystalline silicon germanium and the p-type semiconductor layer and the n-tyoe semiconductor layer in each said pin structure comprises a compound selected from the group consisting of a-Si:H, a-Si:HX, a-SiC:H, a-SiC:HX, a-SiGe:H, a-SiGeC:H, a-SiO:H, a-SiN:H, a-SiON:HX, a-SiOCN:HX, $\mu$c-Si:H, $\mu$c-SiC:H, $\mu$c-Si:HX, $\mu$c-SIC:HX, $\mu$c-SiGe:H, $\mu$c-SiO:H, $\mu$C-SiGeC:H, $\mu$c-SiN:H, $\mu$c-SiON:HX, $\mu$c-SiOCN:HX, poly-Si:H, poly-SiHX, poly-SiC:H, poly-SiC:HX, poly-SiGe:H, poly-Si, poly-SiC and poly-SiGe.

11. The photovoltaic device according to claim 10, wherein the i-type semiconductor layer of the second pin structure has a layer thickness of from 500 nm to 2,500 nm.

12. The photovoltaic device according to claim 10, wherein the i-type semiconductor layer of the second pin structure comprises boron, the boron being contained in an amount of not more than 8 ppm.

13. The photovoltaic device according to claim 10, wherein the n-type semiconductor layer of the second pin structure comprises microcrystalline silicon.

14. The photovoltaic device according to claim 10, wherein the microcrystalline silicon germanium in the i-type semiconductor layer of the third pin structure has an average germanium content of not less than 40 atom %.

15. The photovoltaic device according to claim 10, wherein the i-type semiconductor layer of the third pin structure has a layer thickness of from 200 nm to 2,000 nm.

16. The photovoltaic device according to claim 10, wherein the microcrystalline silicon germanium in the i-type semiconductor layer of the third pin structure is formed by microwave plasma-assisted chemical vapor deposition.

17. The photovoltaic device according to claim 10, wherein the i-type semiconductor layer of the first pin structure has a layer thickness of from 50 nm to 250 nm.

18. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having an i-type semiconductor layer; and the i-tye semiconductor layer of the first pin structure comprises amorphous silicon, the i-type semiconductor laver of the second pin structure comprises microcrystalline silicon, the n-type semiconductor layer of the second pin structure has a laminated structure comprised of a layer comprising microcrystalline silicon and a layer comprising amorphous silicon and the i-type semiconductor layer of the third pin structure comprises microcrystalline silicon germanium.

19. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having an i-type semiconductor layer; and the i-type semiconductor layer of the first pin structure comprises amorphous silicon, the i-type semiconductor laver of the second pin structure comprises microcrystalline silicon and the i-type semiconductor layer of the third pin structure comprises microcrystalline silicon germanium and has spaced, on at least one interface thereof, a buffer layer containing no germanium.

20. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having an i-type semiconductor laver; and the i-type semiconductor layer of the first pin structure comprises amorphous silicon, the i-type semiconductor layer of the second pin structure comprises microcrystalline silicon and the i-type semiconductor layer of the third pin structure comprises microcrystalline silicon germanium, wherein the microcrystalline silicon germanium in the i-type semiconductor layer of the third pin structure has a light absorption coefficient of $10,000^{-1}$ cm or above.

21. A photovoltaic device comprising a plurality of pin structures, a transparent electrode on a light-incident side of the plurality of pin structures and a back electrode on the side opposite to the light-incident side of the plurality of pin structures wherein;

the pin structures comprise a first pin structure, a second pin structure and a third pin structure in the order from the light-incident side, each having a p-type semiconductor layer and an i-type semiconductor layer; the i-type semiconductor layer of the first pin structure comprises amorphous silicon, the i-type semiconductor layer and the n-type semiconductor layer of the second pin structure each comprises microcrystalline silicon and the i-type semiconductor layer of the third pin structure comprises amorphous silicon germanium and the p-type semiconductor layer in each said pin structure comprises a compound selected from the group consisting of a-Si:H, a-Si:HX, a-SiC:H, a-SiC:HX, a-SiGe:H, a-SiGeC:H, a-SiO:H, a-SiN:H, a-SION:HX, a-SiOCN:HX, $\mu$c-Si:H, $\mu$c-SiC:H, $\mu$c-Si:HX, $\mu$c-SIC:HX, $\mu$c-SiGe:H, $\mu$c-SiO: H, $\mu$C-SiGeC:H, $\mu$c-SiN:H, $\mu$c-SiON:HX, $\mu$c-SiOCN:HX, poly-Si:H, poly-SiHX, poly-SiC:H, poly-SiC:HX, poly-SiGe:H, poly-Si, poly-SiC and poly-SiGe.

\* \* \* \* \*

UNITED STATES PATENT AND TRADEMARK OFFICE
CERTIFICATE OF CORRECTION

PATENT NO.    : 6,180,870 B1
DATED         : January 30, 2001
INVENTOR(S)   : Masafumi Sano et al.

It is certified that error appears in the above-identified patent and that said Letters Patent is hereby corrected as shown below:

Column 3,
Lines 5, 30 and 34, "less cause" should read -- cause less --;

Column 10,
Line 48, "$(SiF_2)_5$" (second occurrence) should be deleted and "$(SiF_2)_5$," (3rd occurrence) should read -- $(SiF_2)_6$, --.

Column 11,
Line 10, "$_{PCl3}$" should read -- $PCl_3$ --

Column 24,
Line 46, "Preparotary" should read -- Preparatory --.

Column 32,
Line 51, "nor" should read -- not --.

Column 46,
Line 27, "layers" should read -- layer --.

Column 47,
Line 42, "n-tyoe" should read -- n-type --.

Signed and Sealed this

Twelfth Day of March, 2002

Attest:

Attesting Officer

JAMES E. ROGAN
Director of the United States Patent and Trademark Office